(12) United States Patent
Regnier

(10) Patent No.: US 7,240,316 B2
(45) Date of Patent: Jul. 3, 2007

(54) APPARATUS AND METHOD TO FACILITATE HIERARCHICAL NETLIST CHECKING

(75) Inventor: John W. Regnier, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 497 days.

(21) Appl. No.: 10/122,381

(22) Filed: Apr. 16, 2002

(65) Prior Publication Data

US 2003/0208721 A1 Nov. 6, 2003

(51) Int. Cl.
*G06F 17/50* (2006.01)

(52) U.S. Cl. .............................. 716/11; 716/8

(58) Field of Classification Search .................. 716/4, 716/5, 10–14, 8; 703/13, 17
See application file for complete search history.

(56) References Cited

U.S. PATENT DOCUMENTS

| 5,084,824 | A | 1/1992 | Lam et al. |
| 5,623,418 | A | 4/1997 | Rostoker et al. |
| 6,009,251 | A * | 12/1999 | Ho et al. ...................... 716/5 |
| 6,182,258 | B1 | 1/2001 | Hollander |
| 6,279,143 | B1 | 8/2001 | McBride et al. |
| 6,304,837 | B1 | 10/2001 | Geiger et al. |
| 6,305,003 | B1 | 10/2001 | McBride |
| 6,353,915 | B1 | 3/2002 | Deal et al. |
| 6,367,055 | B1 | 4/2002 | McBride |
| 6,427,223 | B1 * | 7/2002 | Kim et al. ...................... 716/4 |
| 6,539,519 | B1 * | 3/2003 | Meeker ........................ 716/2 |
| 6,801,884 | B2 * | 10/2004 | Ferreri et al. ................. 703/13 |
| 6,886,140 | B2 * | 4/2005 | Regnier ........................ 716/1 |
| 2002/0123875 | A1 * | 9/2002 | Roesner et al. ............... 703/17 |

OTHER PUBLICATIONS

Cadence Datasheets—Arctic Electrical Rule Checker- Retrieved on Apr. 4, 2002 [online], www.cadence.com/datasheets/cadMOSArct.html.
Steven M. Rubin—Computer Aids for VLSI Design—Chapter 5: Static Analysis Tools—Published: Apr. 27, 1987—www.rulabinsky.com/cavd/text/chap05-4.html.

* cited by examiner

*Primary Examiner*—Jack Chiang
*Assistant Examiner*—Binh Tat
(74) *Attorney, Agent, or Firm*—Dickstein Shapiro LLP

(57) ABSTRACT

An apparatus and method are disclosed which determine locations where verification data should exist in a circuit representation and then propagates verification or circuit properties within a circuit representation. For a hierarchical representation of a circuit, a minimum number of modified circuit entities are created and added to the hierarchical representation such that pertinent critical net and property information is represented at each hierarchical level.

19 Claims, 25 Drawing Sheets

FIG. 4b  Gereral Flow
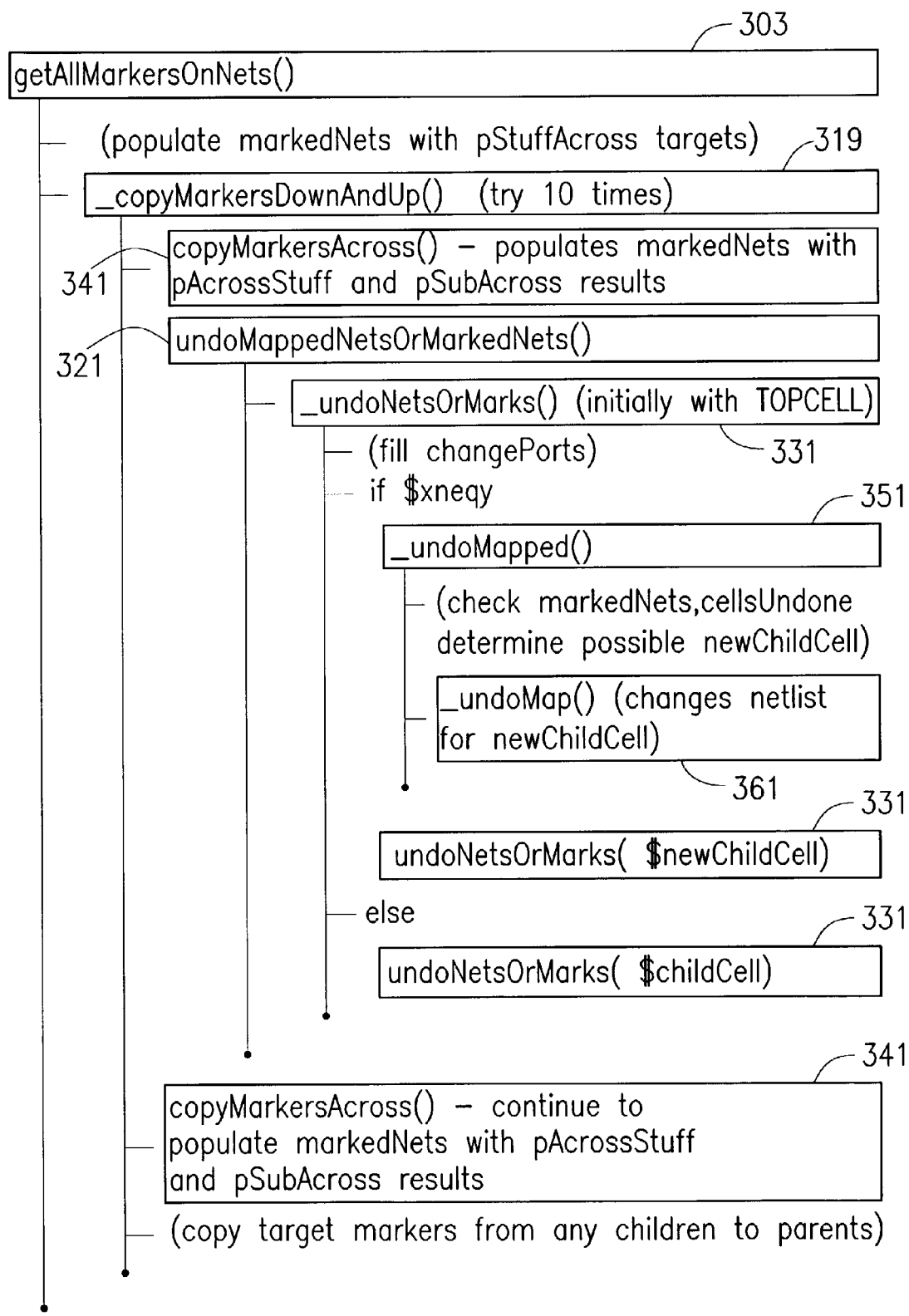

| FIG. 5a-1 |
| FIG. 5a-2 |
| FIG. 5a-3 |

FIG. 5b

| FIG. 5b-1 |
| FIG. 5b-2 |

FIG. 5b-1

533 → &_undoMapped()

561: $childCell been unmapped before and stored in cellsUndone 161?

- Yes → 562: get existing mapping data first
  {{'cellsUndone'}}{{<cell>}}{'aliases'}}{{<#>}}{'pins'}
  %existingPins
  %existingNets
  %existingMarks
  → 563: add current mapping data to
  $pChangePorts
  %existingPins
  %existingNets
  %existingMarks

- No → 565: create a $matchString that describes the port differences (sorting is critical here in this embodiment)
  %existingPins
  %existingNets
  %existingMarks
  $matchString= "A=net5,A=M_HV,A=M_abc,B=M_PAD"
  (If no, must copy with a new version of this cell)

567: cell $matchString exists?

- No → 569: Increment $UNDOMAPNUMBER++

FIG. 7

```
163' ──── cellsUnDone' => HASH(0xa7d978)
              'cellA' => HASH(0xa7d990)
                'aliases' => HASH(0xa7d948)
                  3 => HASH(0xa7d96c)
                    'pins' => HASH(0xa7d900)
                      'A1'=> HASH(0xa7d918)
851                     'net' => 'CGND'
                      'A2' => HASH(0xa7d93c)
                        'net' => 'vcc'
                  5 => HASH(0xc15b28)
                    'pins' => HASH(0xc23100)
                      'A2' => HASH(0xa7d840)
                        'net' => 'vcc'
                      'A3' => HASH(0xc16160)
                        'mark' => HASH(0xc181e4)
                          'M_HV' => 1
                'matches' => HASH(0xc15888)
853 ──────── 'A1=CGND,A2=vcc,' => 3
          ──── 'A2=vcc,A3=M_HV,' => 5
              'cellB' => HASH(0xc15b1c)
                'aliases' => HASH(0xc160ac)
                  2 => HASH(Qxc17100)
                    'pins' => HASH(0xc17118)
                      'B1' => HASH(0xc17130)
                        'net' => 'vcc'
                  4 => HASH(0xc16034)
                    'pins' => HASH(0xc22870)
                      'B1' => HASH(0xc160c4)
                        'net' =>'CGND'
                'matches' => HASH(0xc418b8)
                  'B1=CGND,' => 4
                  'B1=vcc,' => 2
```

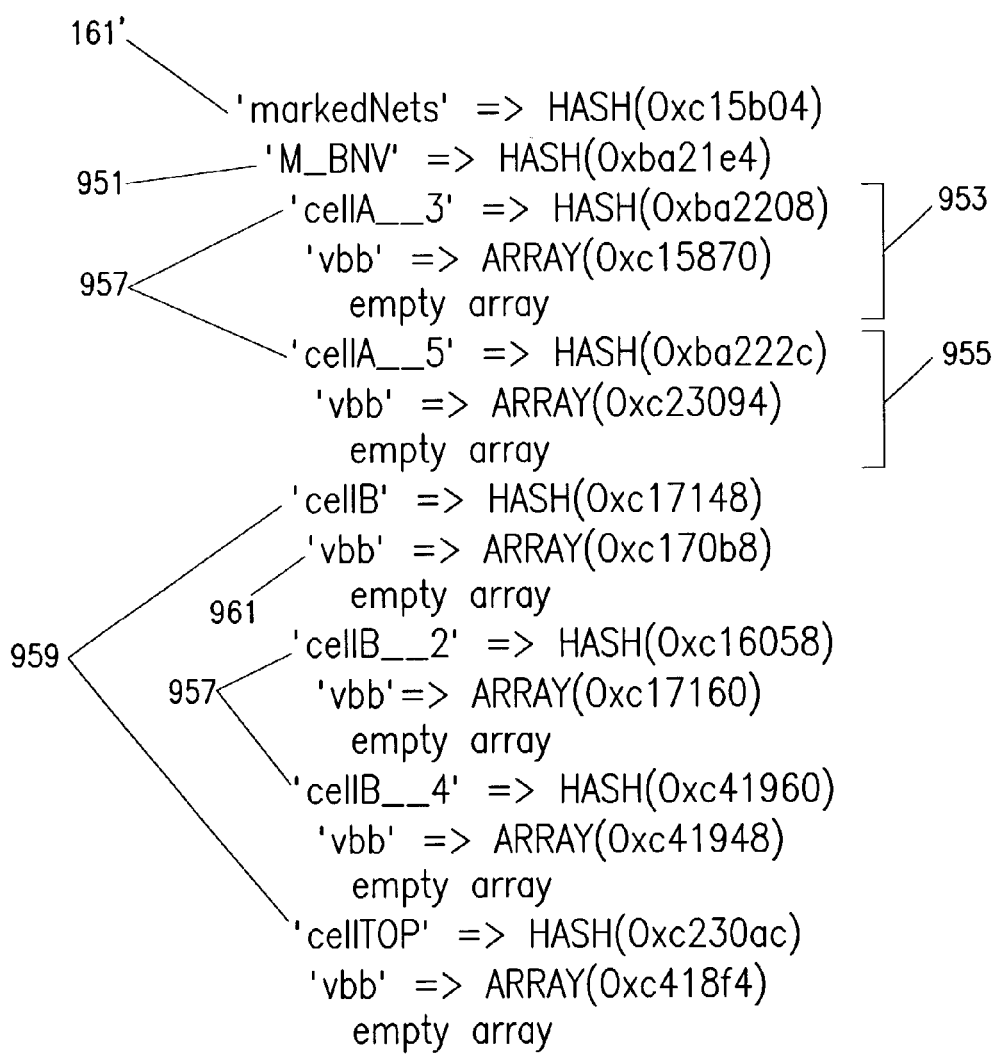

FIG. 8b

```
965
   'M_HV' => HASH(0xa7db1c)
      'cellA__3' => HASH(0xc4a42c)
         empty hash
      'cellA__5' => HASH(0xc26034)
         'A3' => ARRAY(0xa7da80)
            empty array
      'cellB' => HASH(0xc16310)
         empty hash
      'cellB__2' => HASH(0xc4193c)
         empty hash
      'cellB__4' => HASH(0xc41b58)
         empty hash                              ─ 955
      'cellTOP' => HASH(0xa7d84c)
         'IN2' => ARRAY(0xba2124)
967         0 'X0'
   'M_HVOK' => HASH(0xc24948)
      'cellA__3' => HASH(0xc1613c)
         empty hash
      'cellA__5' => HASH(0xc41858)
         empty hash
      'cellB' => HASH(0xc16358)
         empty hash
      'cellB__2' => HASH(0xc248f4)
```

FIG. 9

Output Report

971 — Number of Markers

| Marker | Cells | All |
|--------|-------|-----|
| HV     | 0     | 0   |
| BNV    | 0     | 0   |
| HV     | 1     | 1   |
| HVOK   | 0     | 0   |
| SV     | 0     | 0   |
| SVAF   | 0     | 0   |
| SVAF   | 0     | 0   |
| PAD    | 0     | 0   |

973 — Cells Unmapped ----------------
    CellA
        5  aA2=vcc,A3=M_HV
        3  a1=CGND,A2=vcc,
    CellB
        4  B1=CGND
        2  B1=vcc ---------------- Cells Unmapped

APPARATUS AND METHOD TO FACILITATE HIERARCHICAL NETLIST CHECKING

FIELD OF THE INVENTION

This invention relates generally to the field of design and testing of semiconductor integrated circuits and more particularly to error detection and testing of semiconductor chip schematic designs used in semiconductor manufacturing.

BACKGROUND OF THE INVENTION

Computer aided design (CAD) systems are used to design complex integrated circuits or dies. Schematic designs are created using such CAD systems which describe the integrated circuit components and interconnections between components which will be fabricated within integrated circuit dies.

An IC design can contain many subdesigns (modules) which likewise can contain subdesigns therein. Under this topology, the top level of an IC design typically includes a hierarchical structure of interconnected circuit modules. The overall system is the top most module. The top level module does not usually include any reference to gates or other circuits, but rather refers more to the function accomplished by the top or macro level component(s) which are the largest functional component(s) in the design.

Once a schematic circuit design has been created using CAD systems, it is output as a netlist. Netlists are computer files which contain a textual or character based description of the integrated circuits and the relationships between the circuits or cells that comprise an electronic circuit described by the netlist or schematic design.

Netlists can be organized in the hierarchical or the flat form. A flat data netlist contains multiple copies of the circuit modules without boundary descriptions found in hierarchical representations, usually consisting of module or cell instance names. For example, a flat data netlist will list one or more flat paths describing a string of components that are connected at a highest level in the circuit design hierarchy through a lowest component without hierarchical boundaries such as CellA or CellB. In other words, a flat path is a path statement from a starting place, usually the highest point in that particular path, to a specified endpoint marker or either the lowest or bottom-most primitive component in a particular current or circuit path. The start or stop points can also be selected based upon a desire to test a segment within a larger circuit path.

Chip designs are tested using a variety of computer programs. One type of electronic design automation (EDA) system used to evaluate and perform error checking on the netlist after the design is compiled includes verification systems such as an electrical rule check (ERC) programs, layout versus schematic (LVS) programs as well as simulation programs such as Spice. ERC programs look at a netlist schematic and verifies markers or other specific components are present or not present within the schematic design. ERC programs evaluate circuit designs which test for faults or design flaws that are caused by improper combinations of circuit elements or entities with respect to properties or markers placed in the netlist as well as with respect to critical net names or other circuit attributes. The cell boundaries are checked to ensure the netlist net names have not been changed at a higher level which then creates a different set of net descriptions as cell boundaries are traversed (cell boundaries are where nets enter a cell at a port in the cell). In some cases it is desirable to have consistent net identifications for interconnected nets. Thus, a property can exist on a cell which is changed that corresponds initially to a higher level then a designer changes the higher level net reference, which then creates a discontinuity in net name path identity.

Diagnostic or error checking programs use either flat data or hierarchical data netlists as inputs, depending on the system and checks involved. Many types of conventional verification systems require flat data extracts from hierarchical netlists to perform verification functions. This can take a great deal of time when dealing with very large systems such as a DRAM. For example, a DRAM can have hundreds of millions of cells which the flat list search system must go through and create an absolute path statement to populate the flat data file. Thus, when changes are made to the design, it is necessary to recompile the chip design from a hierarchical format to a flat format. The need to frequently convert from one format to another adds lengthy delays to the chip design project. Also, flat netlists are much larger and hence require more storage, e.g., disk space. Consequently, it is not desirable to be required to create multiple flat data extracts to perform rule checking if it can be avoided. Thus, a need exists to improve the ability for verification systems to determine if designs have errors using hierarchical netlists rather than recompiling flat data extracts for each design change.

SUMMARY OF THE INVENTION

This system and method determines locations where verification data should exist in a circuit representation then propagates verification or circuit properties within a circuit representation. For a hierarchical representation of a circuit, a minimum number of modified circuit entities are created and added to the hierarchical representation such that pertinent critical net and property information is represented at each hierarchical level.

BRIEF DESCRIPTION OF THE DRAWINGS

These and other features and advantages of the invention will be better understood from the following detailed description which is provided in connection with the accompanying drawings.

FIG. 4b shows another view of an exemplary system architecture for one embodiment of the invention;

FIGS. 5a-1 shows a portion of a processing sequence in accordance with an exemplary embodiment the invention;

FIGS. 5a-2 shows a portion of a processing sequence in accordance with an exemplary embodiment of the invention;

FIGS. 5a-3 shows a portion of a processing sequence in accordance with an exemplary embodiment of the invention;

FIGS. 5b-1 shows a portion of a processing sequence in accordance with an exemplary embodiment of the invention;

FIGS. 5b-2 shows a portion of a processing sequence in accordance with an exemplary embodiment of the invention;

FIGS. 5d-1 shows a portion of a processing sequence in accordance with an exemplary embodiment of the invention;

FIGS. 5d-2 shows a portion of a processing sequence in accordance with an exemplary embodiment of the invention;

FIGS. 5d-3 shows a portion of a hierarchical circuit schematic;

FIGS. 5e-1 shows a portion of a processing sequence in accordance with an exemplary embodiment of the invention;

FIGS. 5e-2 shows a portion of a processing sequence in accordance with an exemplary embodiment of the invention;

FIGS. 5e-3 shows a portion of a hierarchical circuit schematic;

FIG. 7 shows an exemplary output in accordance with an exemplary embodiment of the invention;

FIG. 8a shows a portion of an exemplary output in accordance with an exemplary embodiment of the invention;

FIG. 8b shows a portion of an exemplary output in accordance with an exemplary embodiment of the invention; and FIG. 9 shows an exemplary report output in accordance with an exemplary embodiment of the invention.

DESCRIPTION OF THE INVENTION

Figure 3A:
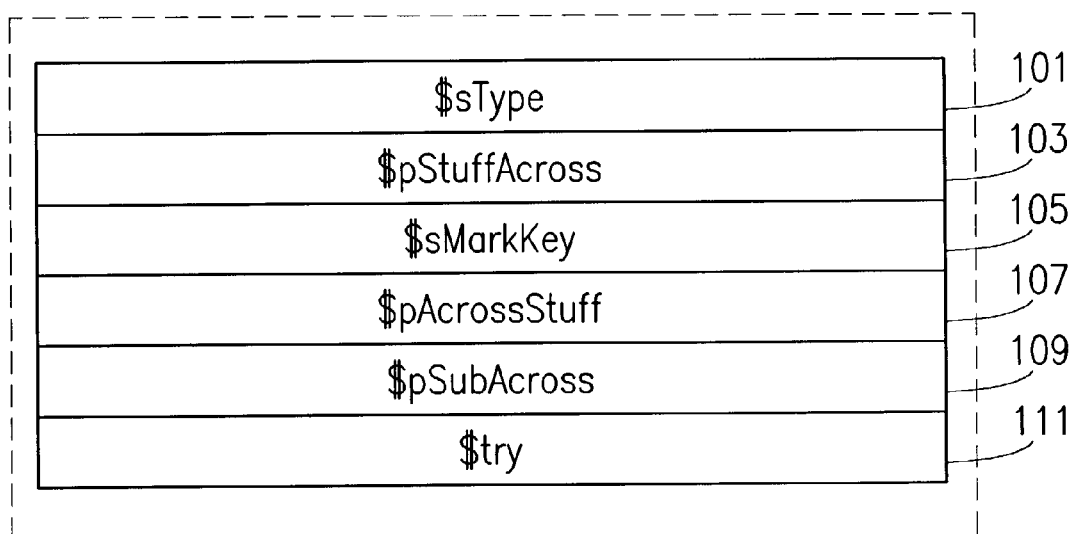
FIG. 3a shows exemplary data structures employed by an embodiment of the invention.
Figure 3B:
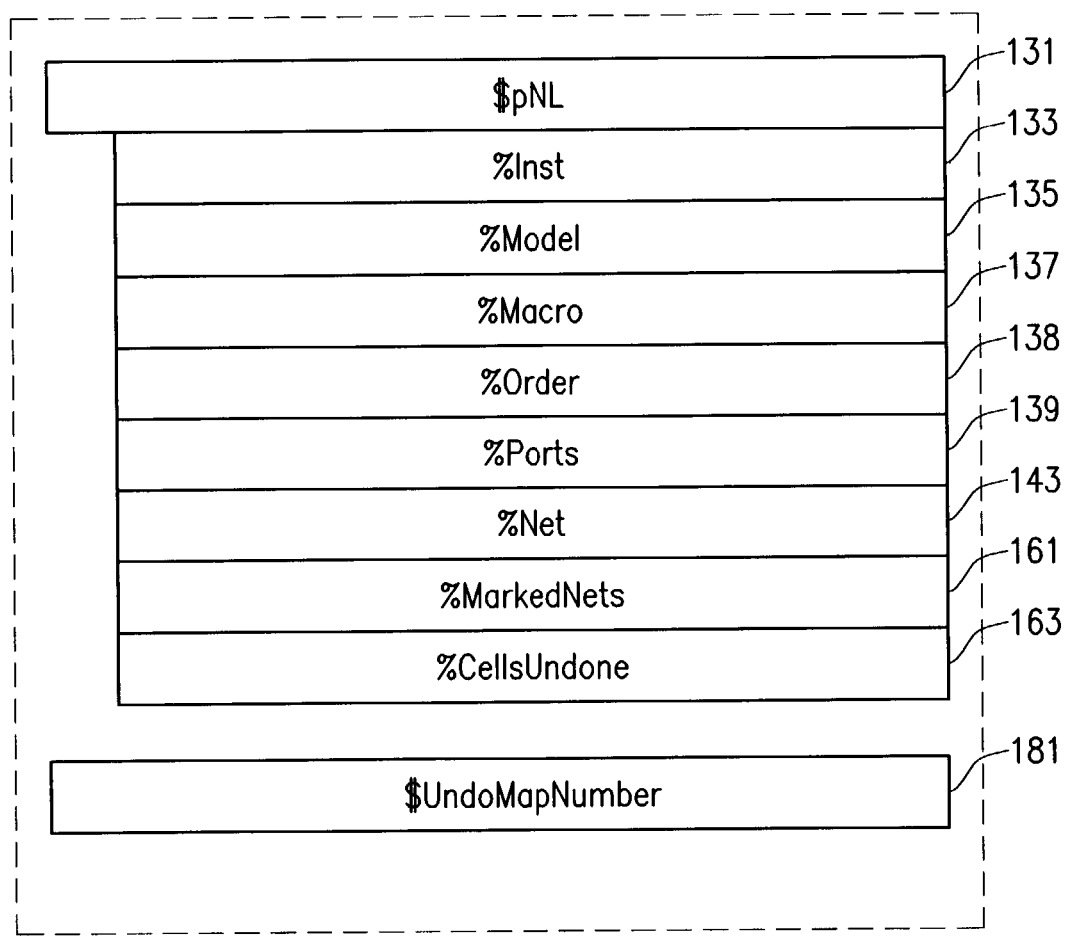
FIG. 3b shows exemplary data structures employed by an embodiment of the invention.

The standard method of verifying a hierarchical netlist is to start at the top and check every instance of every cell in the design down to the bottom level of hierarchy. An engineer using conventional design and testing software cannot simply check each cell in the design and determine if the chip design is acceptable as there can be several instances of a given cell, and each instance of the given cell is usually connected to different nets when it is placed in the netlist $pNL 131 (FIG. 3b). An embodiment of the invention facilitates a way to allow a verification program to verify an entire hierarchical netlist design by checking each cell in the design only one time rather than needing to check each cell multiple times for every instance of the cell. An embodiment of the system, hereinafter referred to as the remapping program, will perform the distribution of circuit attributes required to avoid scanning each cell instance through a hierarchical netlist.

Figure 1:
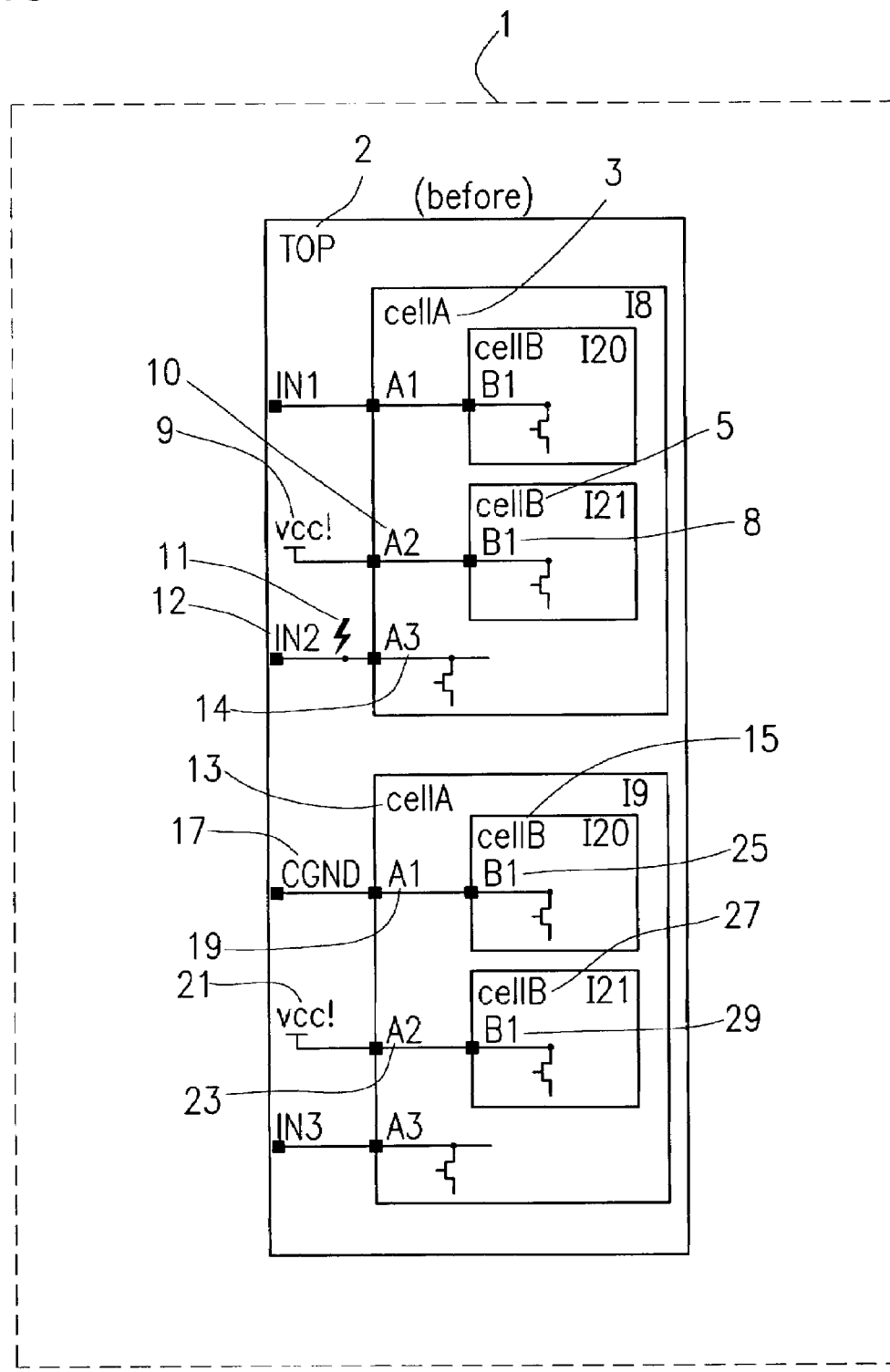
FIG. 1 shows a schematic describing a plurality of hierarchical elements describing a circuit before distribution of marker and net information.

FIG. 1 shows an exemplary graphical representation of a hierarchical schematic netlist (i.e., a partial graphical representation of FIG. 3b, $pNL 131) having a top level module (i.e., TOP 2) and a number of cells with circuit primitives which are scanned by the invention. It should be noted that FIG. 1 is only an exemplary hierarchical schematic and that the invention has universal application to any electrical circuit represented in a hierarchical form. Also, it should be noted that the invention can be used in another embodiment to perform remapping activities with respect to a flat netlist or another type of circuit design representation.

The graphical netlist representation shown in FIG. 1 is stored in the netlist $pNL 131 (FIG. 3b). The netlist $pNL 131 contains a variety of separate data entries or tables which are used to describe the entire hierarchical design. Cell identities, such as CellA 3, are stored in a variety of ways in a netlist. One netlist entry includes models 135 which are stored in this embodiment in a hash data structure which includes model name (a macro or a primitive), cell name, models that are in the cell, instance names of those models. The % Model data structure 135 include a list of models (e.g., macros (also known as cell types) such as cellA, cellB and cellC as well as primitives such as cpointhv (See FIG. 5d-3, 663) or a resistor (See FIG. 5d-3, 659). The model description within the % Model data structure 135 includes model names (e.g., cellA), model names and instance names (e.g., instance 1(I1)) for a particular model within a model. In other words, when a model such as CellA contains another model such as CellB, CellB will include an instance name which indicates exactly what instance of CellB is within CellA. Note that all the cells are found in only one place in the exemplary netlist $pNL 131 data structure under the % Inst 133 data structure. The other netlist 131 entries include only a reference to the cell name within the % Inst 133 data structure rather than a duplicate of the entire contents of each cell itself. A benefit of using an embodiment of the invention in processing a hierarchical netlist, among other things, is to populate the % Inst data structure 133 with additional macros or cells types that describe the various cells that differ from existing cells described in the % Inst data structure 133 at the commencement of processing.

As mentioned above, the highest level in a hierarchical design is the top level which usually describes the largest module(s) or component(s) which make up the hierarchical design (e.g., TOP 2). Cells which contain other cells, for example referring to FIG. 1, Cell A, instance 8 (I8) 3 which contains CellB, (I21) 5, are also known as parent cells since a parent cell (e.g., cellA 3) contains one or more child cells (e.g., 5).

Sub-modules or components contained within the topmost or higher levels module or component schematics are referred to as child cells (e.g., 5). The child cells of FIG. 1 include CellB, (I21) 5, since is included within CellA (I8) 3. Child cells can have either specific circuit components within them or other child cells within them or both.

The term "instance" is used to distinguish between cells with the same name that are used within a circuit representation, for example instance 8 (I8) of CellA 3 and instance nine (I9) of CellA 13. The term instances, such as instance eight (I8) of CellA 3 in FIG. 1, is a descriptor that symbolizes an occurrence of a cell in a specific circuit design (e.g., CellA, I8) rather than a generic description of the cell in isolation and without reference to the cell's location within a circuit design's hierarchy (e.g., CellA). The same generic cell can have several instances or occurrences of itself. For example, the generic CellA in FIG. 1 has two instances, CellA I8 3 and CellA I9 13. Each occurrence of a cell within a hierarchical design is given an instance number, e.g., within TOP 2, there are two cell instances of CellA 3, 13. Within CellA I8 3 there are multiple cell instances including CellB I21 5.

The schematic of FIG. 1 also describes nets which are used within a hierarchical circuit design. A net is a descriptor that references an interconnection of some type between cells or components found within a hierarchy. Nets run from the top-most hierarchy of a circuit design to child cell ports as well as between ports on lower level parent and child cells.

For example, referring to FIG. 1, net vcc! 9 runs from TOP cell 2 to CellA I8 3. From the port that vcc! 9 connects to on CellA I8 3, net A2 10 runs inside CellA I8 3 from a "from port" in CellA I8 3 to a child instance cellB I21 5 within Cell A I8 3. Another net runs from the port which A2 is connected to, B1 8, to a circuit component where net B1

8 terminates. A signal or voltage goes through components in a cell, but CAD tools see different net names for carrying a voltage from one component to another component in most cases. A net terminates at port on a component, then another net begins on the other side of the component's port. Thus, cells or nets define beginning and ending interconnections or interfaces between cells and from other nets running to points within cells. Other nets in FIG. 1 include the string of nets CGND 17, A1 19 and B1 25 which run from TOP 2 to a port into CellA I9 13, thence from a port inside CellA I9 to port into CellB I20 15, thence from a port inside of CellB I20 15 to a component within CellB I20 15. Another set of nets which run in sequence is vcc! 21, A2 23 and B1 29. These nets are connected in the same manner, that is ports into and from a cell boundary, as the other nets which are connected in sequence.

A marker is a property or attribute which is added to a netlist which, among other things, are used to identify critical netlist or circuit attributes. Markers are used to perform verification or error checking on the netlist before or after the design is compiled. Markers such as high voltage (HV) net markers, super voltage (SV) net markers, pad markers, super voltage fuse markers, negative voltage net markers for lower voltage charge pumps (lower than zero volts) and other types of markers are used to identify particular design attributes which are of special interest to a circuit designer. An ERC system, verification system or other error checking system will not be able to identify a defective design aspect if a marker is not present to describe a critical attribute which the designer knows to be present, but is not marked as existing in the netlist at some point in the circuit hierarchy.

For example, a manual inspection of the hierarchical circuit in FIG. 1 would show that net A3 14 within CellA I8 3 connects to the port for CellA I8 3 which is also connected to IN2 12. Net IN2 12 has a high voltage marker 11 on it. Both net IN2 12 and net A3 14 are connected to the same port on Cell A I8 3, thus they both carry high voltage. A designer would be very interested to know that even though net A3 14 has high voltage on it, there is no marker on net A3 14. Consequently, it would be important to mark net A3 14 as carrying high voltage so that the designer can use the ERC or DRC programs to automatically check to see if any combination of circuits or nets associated with net A3 14 will lead to damage or malfunction in the integrated circuit being designed.

Figure 2:
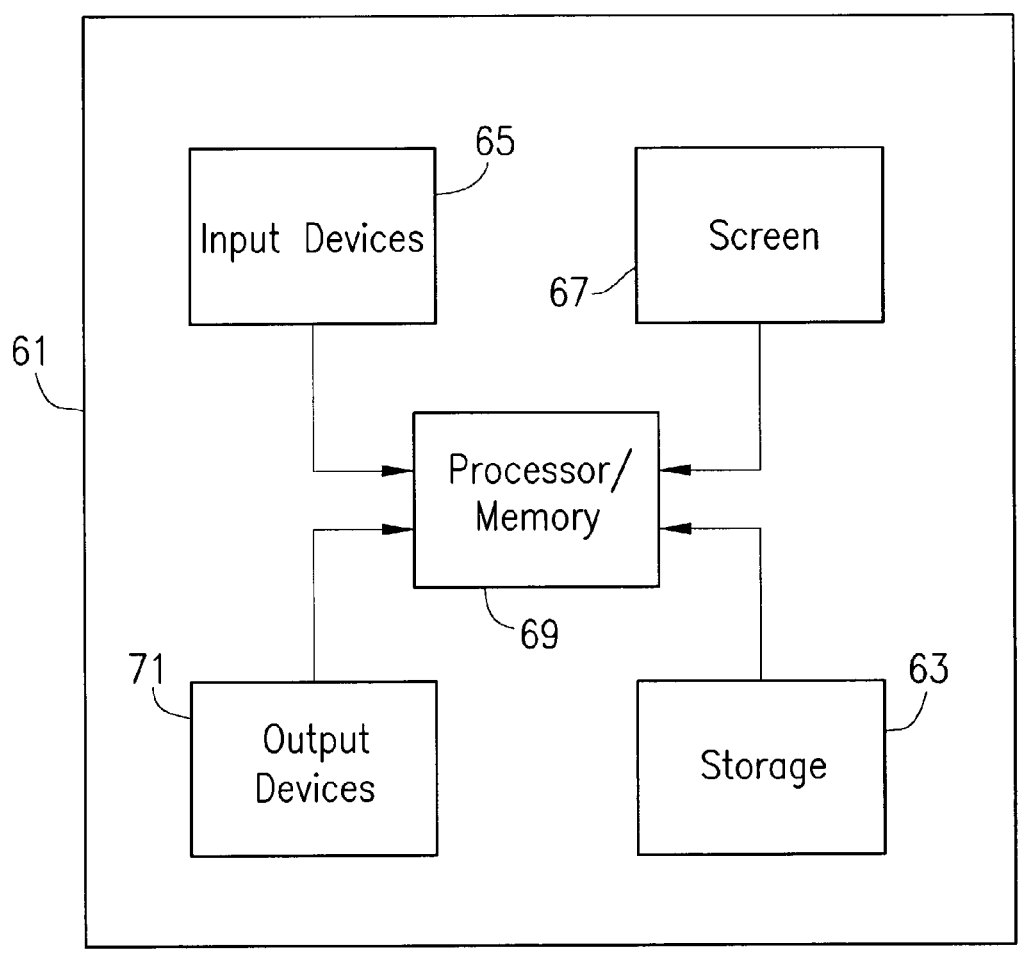
FIG. 2 shows a system employing an embodiment of the invention.
Figure 4A:
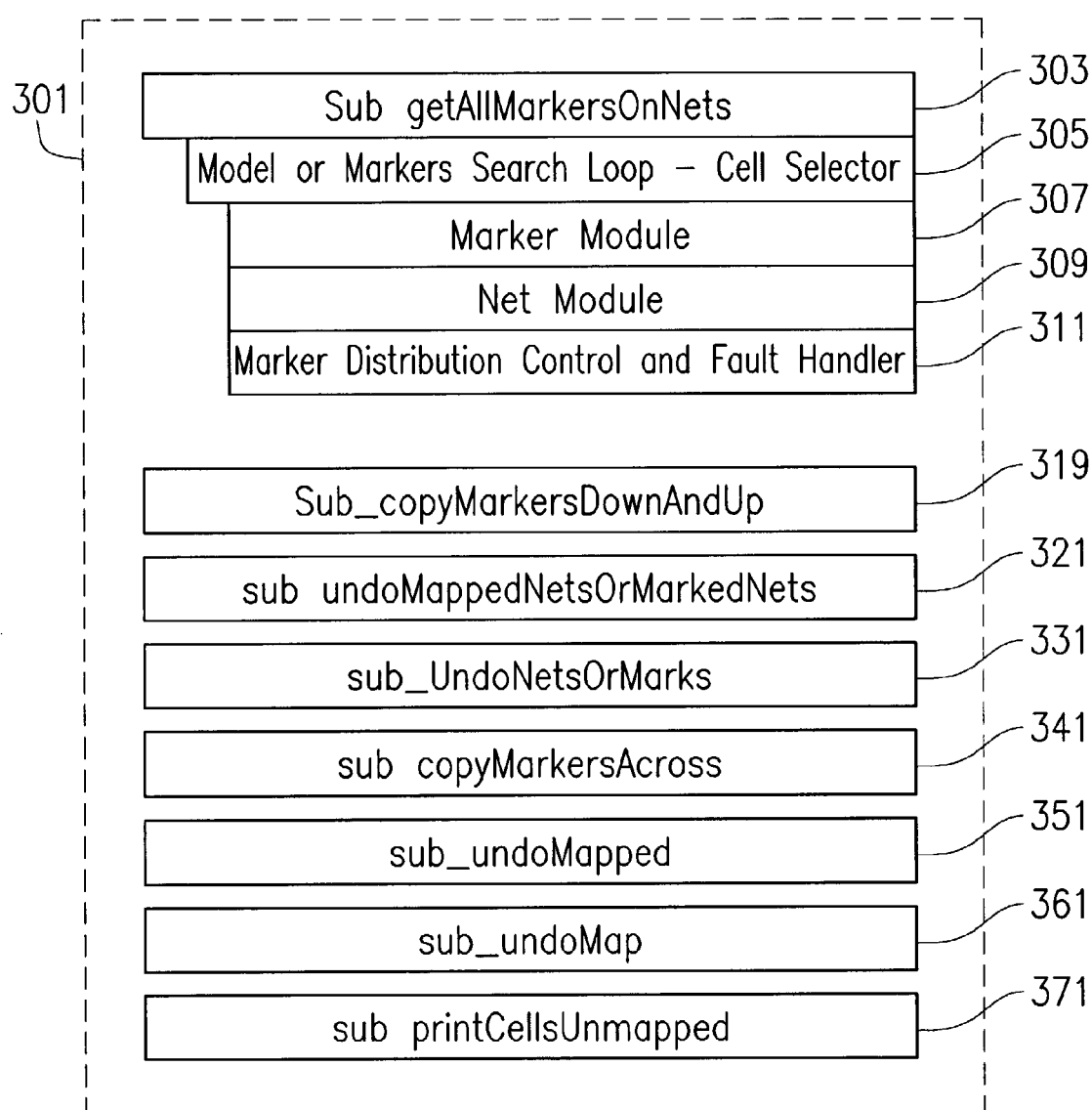
FIG. 4a shows exemplary system architecture for one embodiment of the invention.

Referring to FIG. 2, a computer system 61 employing an embodiment of the invention is disclosed. A storage device/medium 63 stores and retrieves the flat data extraction program as well as the variables and other required data elements. Command inputs are made through input devices 65 to activate the remapping program and input commands. The screen system 67 can display status, commands and results associated with the remapping program. The processor/memory 69 executes commands and manipulates data associated with the remapping program 301 (FIG. 4*a*). The printer 71 outputs modified netlists 131 or other data, including mapping or other reports, as specified in the remapping program or as directed by commands input through input devices 65. Output information or data can also be stored into a data storage medium or transferred to other computer systems. Alternatively, other system architectures can be used to perform the attribute distribution feature of the invention in other embodiments which permit accomplishment of this function and other functions described herein.

Figure 6:
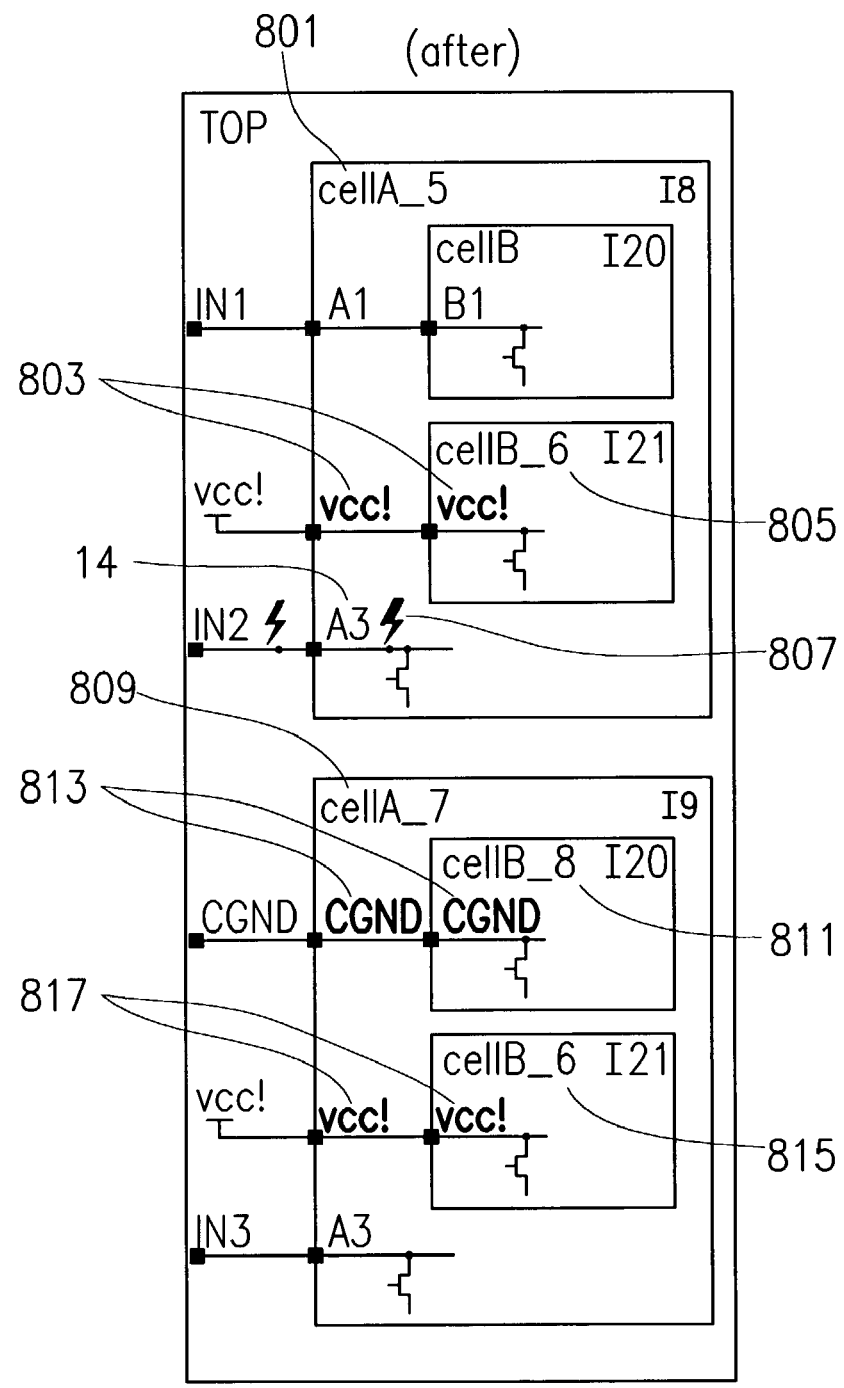
FIG. 6 shows an exemplary schematic of a netlist after processing by an embodiment of the invention.

A general high level description of an embodiment of the invention will now be provided. An embodiment of the invention first receives an input of a netlist (e.g., $pNL 131) and a list of critical verification data including nets (nets significant to the circuit design verification or error testing procedure) and critical circuit attributes (e.g., marker names, gate identifiers or n-channel gates) that exist in nets in the circuit design. Both the input critical nets and critical circuit attributes are evaluated by verification or error checking systems to identify design errors or potential circuit faults such as ERC or LVS programs. An embodiment of the remapping system 301 then identifies where the design attribute or verification data (e.g., FIG. 1 high voltage marker 11 or Vcc! net 9) are specified in the netlist $pNL 131 and determines where the critical design properties or attributes should be in order for a verification or error checking system to locate a fault which may be associated with the critical design property or attribute. For example, an embodiment of the remapping system will scan a netlist (e.g., $pNL 131) and determine that a marker, such as a high voltage marker, is on a net which connects to a port which has another net connected to that port which is not marked as having high voltage, thus a verification or error system will not detect that a high voltage is on the second connected net. (e.g., compare FIG. 1 showing a HV marker 11 on net IN2 12 and no HV marker on net A3 14 with FIG. 6 showing an HV marker 807 now on net A3 14). Next, the embodiment of the remapping system 301 distributes the designated verification data, through the circuit design hierarchy to the locations where the critical design properties or attributes should be present for a verification system to make use of such data then saves the remapped cells or circuit elements as a new standard cell or element identity (e.g., FIG. 6 renamed cell identity of CellA_5 I8 801 which was changed based upon the above remapping).

An embodiment of the remapping program 301 (FIG. 4*a*) accepts a variety of inputs which indicate the search targets, e.g., critical nets and circuit attributes, then performs the distribution of attributes through a hierarchical design (e.g., FIG. 1) or another type of circuit representation. A designer can select and input the critical nets of interest and/or circuit attributes based on desired circuit checking, net name or the surrounding circuitry or elements that are on the net. Typically, a designer knows which markers, nets or circuit attributes which merit scrutiny or fault analysis. Consequently, ERC, LVS or other fault analysis systems are designed to search out critical or fault data, then perform analysis on that data. Thus, a designer will be able to determine which markers, nets or attributes should be input into the remapping system 301 (FIG. 4*a*). It should be understood that a circuit analysis system could also be used to determine which markers, nets or attributes should be input into the remapping system 301 in addition to a manual input by a circuit design or test personnel.

One advantage of a remapping approach is that a minimum number of new cells are created from copies of cells that have the same internal nets connected to different external nets. A few new cells are created, however the remapping program 301 only has to perform a scan of each cell type (e.g., FIG. 3*b*, % Model 135) once as contrasted to scanning all child instances within each and every cell instance in a design. As an example, a cell that is placed 32 million times might only be hooked up six different ways in the design (e.g., different nets or combinations of cells and port Ids which are critical models/ports or nets), so it is faster to store a renamed version of the cell five times and check each of the six cells instead of having to check each of the 32 million instances of the cell.

A detailed description of an embodiment of the invention will now be provided. FIGS. 3a, 3b, 3c and 3d show data structures employed by one embodiment of the invention. FIG. 3a shows data structures used as input arguments to the remapping program 301. The first input data is $sType 101 which is used to designate whether or not the search target(s) will be nets or markers. An example of a net shown in FIG. 1 is Vcc! 9 and an example of a marker is the high voltage marker 11 on net IN2 12. Data structure $pStuffAcross 103 contains a list of some of the search targets which are, in this embodiment, models with ports for those models or nets which will be marked or annotated in a separate data structure with the $sMarkKey 105 identifier(s). The $sMarkKey 105 is a label or header ID which contains a name to be associated with search target nets or models/ports which are being "marked" for further processing. In this embodiment, cells and/or nets are listed underneath the $sMarkKey 105 element in the % MarkedNets 161 data structure discussed in FIG. 3b. For example, M_HV, M_HVOK, M_13_vcc, M_13_gnd or M_BNV are all examples of $sMarkKeys 105. The data under each $sMarkKey 105 header is used in an embodiment of the invention to identify or group the models, nets or other circuit entities containing nets, model/port combinations or other circuit attributes which are being scanned for by this embodiment of the remapping program 301. The marked port, net or circuit entity data is then used to determine verification data placement locations where verification data is then placed in the netlist. Any sequence of characters which can be used as a label to identify the component or circuit attribute which is being scanned for in a particular run of the remapping system 301 can be used. The $pAcrossStuff 107 data structure contains a pointer to a list of circuit elements, circuit entities, properties or attributes which are associated with or related to another one or more circuit elements, circuit entities or properties with respect to one or more nodes, circuit elements or circuit entities. For example, FIGS. 5d-3 shows a resistor 659 with a port A 658 and a port B 660. In this case, $pAcrossStuff 107 would store a model name (i.e. "resistor") and the ports of that model (i.e., "A" and "B") which is used to select a primitive such as resistor 659. Using a cell example, FIGS. 5d-3 shows CellA I15 (667) which includes port A 665, port Y 669 and port Z 671. In this example, $pAcrossStuff 107 would store a model name (i.e., CellA (not the instance name)) and the associated ports of interest for verification or analysis purposes (i.e., "A", "Y" and "Z") The data structure $pSubAcross 109 contains a pointer to one or more predefined or user defined subroutine(s) which will be checked for applicability to a design combination and executed if applicable to determine if the changes, which would otherwise be triggered based on the data in $pAcrossStuff 107, should in fact be accomplished. The $pSubAcross 109 data structure contains data which provides a special case or override feature for certain situations where either the designer or a system fault checking system determines that one or more changes to the netlist $pNL 131 that would otherwise occur is not desirable due to a variety of reasons such as a change would result in a circuit fault or adverse performance. Also, a designer may have in mind a circuit description which would better facilitate error checking, verification data analysis, verification data propagation or other circuit design activities or design that would be facilitated by a different change which the invention would automatically otherwise accomplish. The $try 111 data structure is used as an input argument for the _copyMarkersDownandUp module 319 to indicate how many times the _copyMarkersDownAndUp 319 module attempts to converge changes made in the netlist.

Referring to FIG. 3b, a netlist $pNL 131 is shown which contains the circuit attribute and net data which will be parsed and populated with new or revised data structures with verification data, locations which contain verification data and remapped cells, among other things, by an embodiment of the remapping program 301. Within the netlist 131, a number of related data structures exist, in this embodiment, in a hash table structure. Data structure % Inst 133 contains the instances of circuit elements within the netlist 131. The % Model 135 data structure includes descriptions of standard cells or components which consist of primitives or macros which have elements (e.g., cells, models or primitives) within the model. The data structure % macro 137 contains a list of macros or standard cell types in the netlist. The % Order 138 data structure contains a list of standard cell types (also listed in macro 137) which is listed in sequence from lowest level of hierarchy to highest level of hierarchy. The % Ports data structure 139 store the name of the net which is connected to a cell from a higher hierarchy to a lower hierarchy. In other words, a port is a place where a parent cell or higher level cell (or other instance, e.g., a resistor) connects to a child cell or lower level cell attribute. The % Net 143 data structure describes the nets within the netlist 131 and the instances and ports of the instances on the nets. In this embodiment, the % Net data structure 143 is added to the netlist when the subroutine instToNet (not pictured) is called, which is a utility called by the program or user which calls the remapping program 301 in this embodiment.

Within the netlist $pNL 131, there are additional data structures added which are, in this embodiment, used to store the data used to perform the circuit attribute distribution function of the remapping program 301. However, it should be understood that the invention is not limited to the organization of the data structures within the netlist $pNL 131 since a variety of data structures or system architectures can be used to perform the invention's functions such as scan, remap or attribute distribution features of this embodiment of the invention.

The MarkNets data structure 161 contains marked attribute or net information. Within % MarkedNets 161, the value stored in $sMarkKey 105 is appended to the % MarkedNets 161 data structure each time another program or user calls the GetAllMarkersOnNets (FIG. 4a, 303) subroutine discussed below. The data stored in the current $sMarkKey 105 is used to label the current set of marked information being collected or appended to % MarkedNets 161 (e.g., FIG. 8a, M_BNV 951). The remapping system 301 can also be used with a sequence of $sMarkKey 105 identifiers as well as one $sMarkKey at a time. Beneath $sMarkKey 105, a block of data is appended to the file each time a search target is found which is listed in $pStuffAcross 103 and $pAcrossStuff 107 (e.g., FIGS. 8a and 8b, cellA_3 953, cellA_5 955). In this embodiment, different data will be appended to the % MarkedNets 161 data structure when different categories of search targets are found given the data which is found in the $sType 101 data structure (e.g., "net" for net or "mark" for marker corresponding to models/ports or circuit attributes). However, another embodiment may have multiple values as well as different values stored in $sType 101. If $sType 101 has "mark" stored in it, then when a model/port combination from $pStuffAcross 103 or $pAcrossStuff 107 (in accordance with $pSubAcross 109 subroutines if present) is found, an entry comprising a cell type/macro name (a target specified in $pStuffAcross 103 or $pAcrossStuff 107), the net name the cell type/macro is connected, and a child instance of the target is stored each time a search target is found (e.g., FIG. 8*a*, 957) which is explained further below. If $sType 101 has "net" stored in its data structure, then a data block will be appended comprising data found in $sMarkKey 105, $thisCell (i.e., 203, 233), $markNet 219 (copied from $pStuffAcross 103) and either an instance name of the net search target in $pStuffAcross 103 or an empty array. The % CellsUndone data structure 163 stores the root cell name (e.g., CellA) and the aliases and matches (which are compliments of each other for easier searching of the data structure) indicating the different ways the root cells have been unmapped thus far. The alias (e.g., 162) of a root cell (e.g., 161) stores the pins (also called ports) for the cell and any associated net name differences or properties that made this remapped cell different from the root cell. This provides a way to compare a current cell in the design hierarchy and determine if it needs to be remapped or if the port properties are identical to a cell that has already been remapped. If a cell has already been remapped that matches the current cell properties, then only a rename occurs versus a copy and a rename operation.

Another global data element is the $UndoMapNumber 181 data structure that stores data which is used to name the remapped cells, in this embodiment, by appending a number stored in $UndoMapNumber 181 to a cell root name which is being processed, e.g., cellA. This global variable provides one way of creating unique cell names.

Figure 3C:
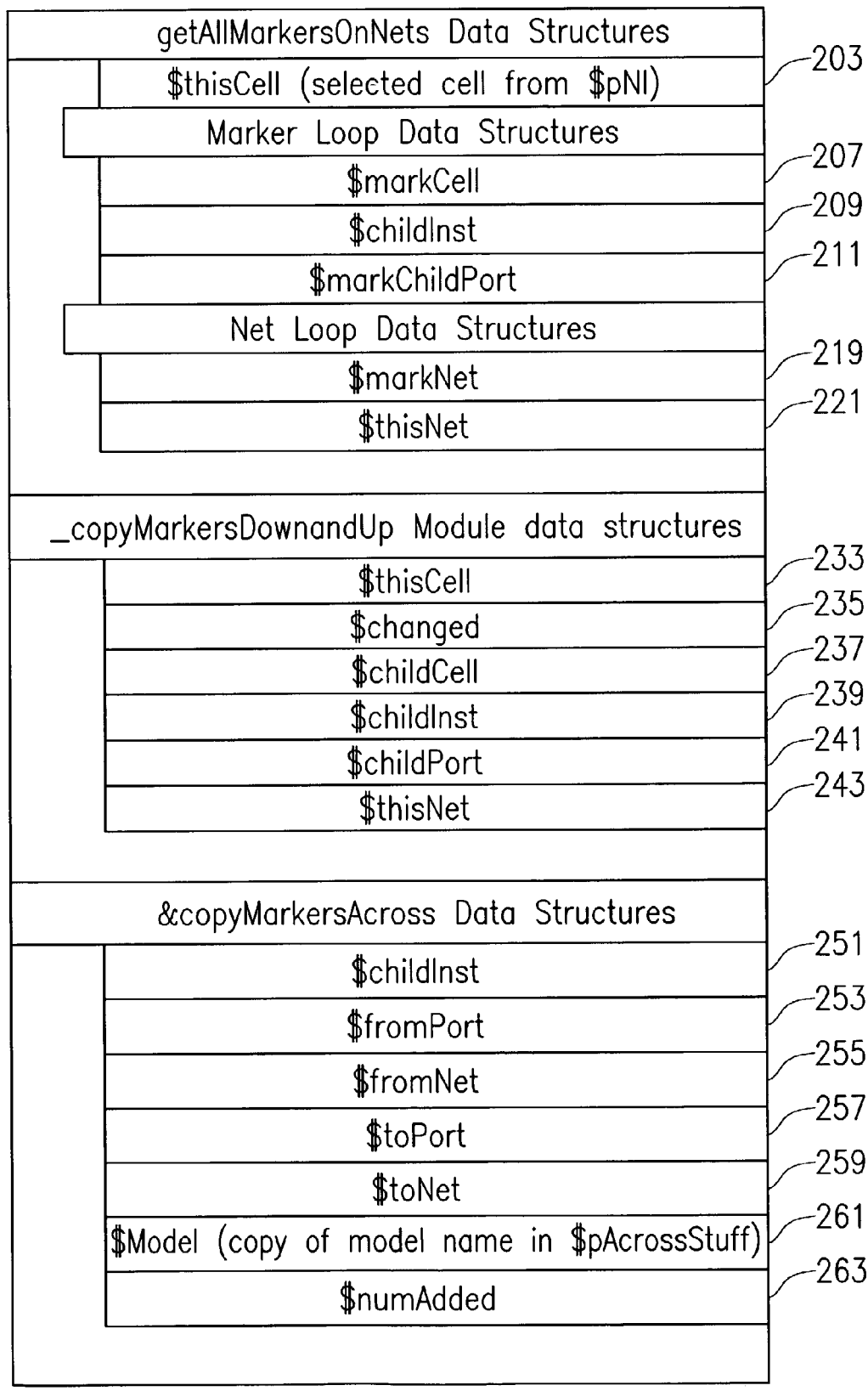
FIG. 3c shows exemplary data structures employed by an embodiment of the invention.
Figure 3D:
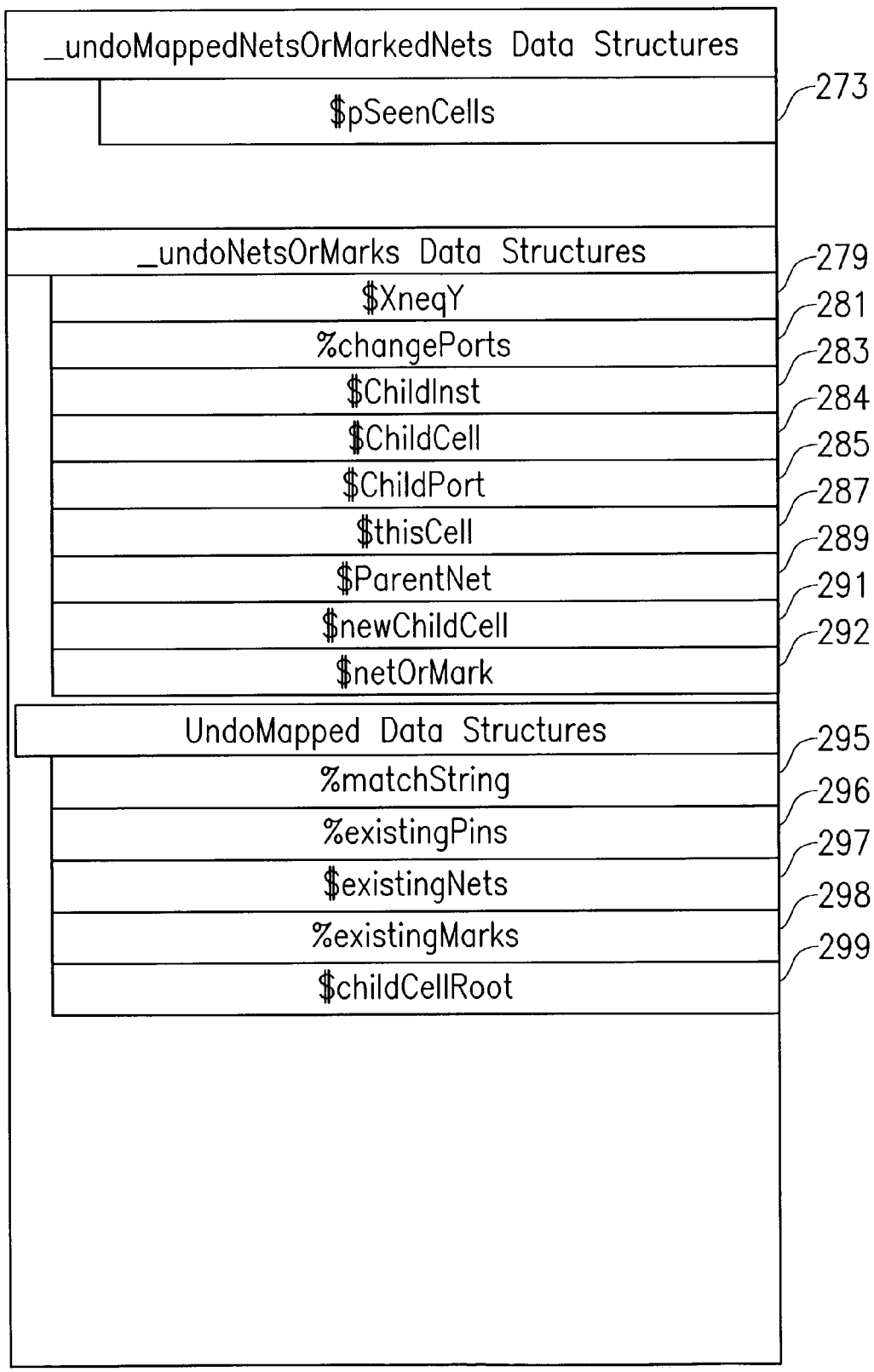
FIG. 3d shows exemplary data structures employed by an embodiment of the invention.

Referring to FIGS. 3*c* and 3*d*, a listing of some of the subroutine data structures used by an embodiment of the remapping program 301 to perform scanning and remapping tasks is shown. These data structures are typically loop data structures which are not global variables. However, the variables may be global variables. The variables in FIGS. 3*c* and 3*d* may be passed down to lower level subroutines then reused over again.

Referring to FIG. 4*a*, major modules or components of an embodiment of the remapping system 301 is disclosed. The getAllMarkersOnNets module 303 accepts as inputs $sType 101, $pStuffAcross 103, $sMarkKey 105, $pAcrossStuff 107 and $pSubAcross 109 as well as the netlist $pNL 131. GetAllMarkersOnNets 303 takes input data then performs searches of the models or nets in the netlist $pNL 131 which contain nets, markers or attributes listed in the $pAcrossStuff 107 or $pStuffAcross 103 (as modified by $pSubAcross 109 if applicable). GetAllMarkersOnNets 303 then marks nets in all cells that are certain models/pins or nets as specified in the $pStuffAcross data 103 structure and next spreads the marked net or model/port information throughout the netlist $pNL 131 hierarchy including across devices/ports specified in the $pAcrossStuff 107 data structure. In so doing, a minimum number of cells are created to accommodate the distribution of verification information.

The module getAllMarkersOnNets 303 creates several data structures as local scope loop variables including $thisCell 203 (the current loop selected cell which the loop increments through that is listed in netlist $pNL 131 element Macro 137), $MarkCell 207 (search targets listed one at a time from $pStuffAcross 103), $childInst 209 (each instance is checked one at a time which matches value returned from use of "keys %" (a utility not pictured) command thereby returning stored values in the netlist $pNL 131 which match % Model 135, $thisCell 203 and $MarkCell 207) and $markChildPort 211 (each instance of @{$$pStuffAcross{$markCell}} which is a variable used during program loop executions which examine all the ports on the instances of the selected model corresponding to models/ports listed in $pStuffAcross 103).

Within getAllMarkersOnNets 303, two submodules, marker module 307 and net module 309 operate to perform the getAllMarkersOnNets 303 functions for marker (e.g., models/ports, attributes) and net search targets within $pStuffAcross 103 or $pAcrossStuff 107 respectively. In this embodiment, the selection of marker module 307 or net module 309 is accomplished by the getAllMarkersOnNets 303 checking to see what value is stored in $sType 101 (e.g., "net" or "mark"). If the scalar string "net" is stored in $sType 101, then net module 309 will execute. If the scalar string "mark" is stored in $sType 101, then the marker module 307 will execute. Generally, the getAllMarkersOnNets 303 module loops through the cells listed in macro 137 examining the cells for the search targets listed in $pStuffAcross 103 and $pAcrossStuff 107. The getAllMarkersOnNets 303 module will append to the $pMarkedNets 161 data structure cells and nets in a manner to indicate the cells and/or nets are marked which is shown in the exemplary data of FIG. 8*a* and FIG. 8*b* discussed further below.

The _copyMarkersDownAndUp 319 module is called by getAllMarkersOnNets 303 to copy all markers down to child cells as represented in % CellsUndone 163 and, among other things, starting from the bottom of the circuit hierarchy copies all markers up to the parent cells returning to a positive number if a marker was copied up to a higher level indicating something was changed. The _copyMarkersDownAndUp module 319 accepts as inputs the $try (FIG. 3*a*, 111) input variable (which indicates the number of times a module is run and a change is detected), a pointer to the netlist $pNL 131, $sMarkKey 105, $pAcrossStuff 107, and $pSubAcross 109.

UndoMappedNetsOrMarkedNets 321 unmaps the nets or markers across cell ports and creates new cells when a change is detected. UndoMappedNetsOrMarkedNets 321 calls _undoNetsOrMarks 331 which in turn calls other subroutines. The input arguments for _undoNetsOrMarks 331 include the netlist $pNL 131, $sMarkKey 105 and $netOrMark 292 (FIG. 3*d*) (which is a copy of $sType 101). The _undoNetsOrMarks 331 module checks each child cell starting with the cell loaded into $thisCell 287 (TOP cell for the first loop iteration in this embodiment) for different nets or markers across the ports of the child cell, makes a list in the % changePorts (FIG. 3*d*, 281) data structure. If the ports are different in a cell than the ports listed in the standard cell description in % Model 135 and the cells (macros) contains search targets from $pAcrossStuff 107, then _undoMapped 351 is called to create the new cell identity which creates a new cell that describes the unique cell structure with search target attributes specified. If the ports are the same on the scanned cell, then _undoNetsOrMarks 331 will recursively call itself with $childCell 284 passed as an input argument into $thisCell 287 for the recursive call until the bottom of the hierarchical representation is reached.

The _undoMapped 351 module prepares information about port mapping on standard cells, checks if a cell already exists then calls _undoMap 361 with the new cell name for the child cell which is being created and stored as a new cell identity in % CellsUndone 163. The _undoMap 361 module changes the netlist $pNL 131 by changing the cell name and adding the new cell or changing the child cell to point to the existing new cell. The input arguments for _undoMap 361 include the netlist $pNL 131, $thisCell (FIG. 3*d*, 287), $childCell 284, $childInst 283, $pnewChildCell (a pointer to $newChildCell 291 which stores a child cell root name (in this embodiment, for the child cell selected in _undoNets OrMarks 331) coupled to three underscore delimiters "_" coupled to the next unique $UndoMapNumber 181, e.g., "CellA_5"), $pChangePorts (pointer to hash of ports to change in % changePorts 281) and $netOrMark 292 as copied from $sType 101. The printCellsUnmapped 371 is one of the output modules in the remapping program 301 which produces output.

Referring to FIG. 4b, a general view of relationships between modules in an embodiment of the invention is shown. This view shows an abstracted view of how the modules interact with each other. It is important to note that some of the loop behavior has been omitted to permit simplification of the module relationships. The getAllMarkersOnNets module 303 receives inputs including the netlist $pNL 131 then begins processing by adding net and circuit information of each cell which had search targets listed in $pStuffAcross 103 to % MarkedNets 161. The getAllMarkersOnNets module 303 calls the _copyMarkersDownAndUp module 319 which calls copyMarkersAcross module 341 which populates % MarkedNets 161 with data based in part upon $pAcrossStuff 107 and $pSubAcross 109 search target data. After copyMarkersAcross 341 has completed processing, then undoMappedNetsOrMarkedNets 321 is called by _copyMarkersDownAndUp 319 which then calls _undoNets OrMarks 331. _UndoNetsOrMarks 331 populates the % changePorts 281 data structure, determines if changes exist or were made during processing to a cell then calls _undoMapped 351. _UndoMapped 351, among other things, checks % MarkedNets 161 and % CellsUndone 163 to determine possible $newChildCell 291 identities then calls _ undoMap 361 to add new cell identities to the % CellsUndone 163 data structure with the child cell data as well as the netlist $pNL 131. When _undoMap 361 completes processing and the nested loops from _copyMarkersDownAndUp 319 complete processing, then copyMarkersAcross 341 is again called to continue to populate % MarkedNets 161 with data based in part upon selection criteria in $pAcrossStuff 107 and $pSubAcross 109. The targets or properties which were found are then added to the respective parent cells throughout the netlist $pNL 131.

Referring to FIGS. 5a-1 through FIG. 5e-3, exemplary processing sequences that may be used to carry out an embodiment of the invention are disclosed. At processing segment 501, processing is initiated by loading an input data including the hierarchical netlist $pNL 131 as well as global variable data including $sType 101, $pStuffAcross 103, $sMarkKey 105, $pAcrossStuff 107, $pSubAcross 109 and $try 111 into the processing system 61 through either the input device 65 or from storage 63. The getAllMarkersOnNets module 303 is called at processing segment 503 to populate the % MarkedNets 161 data structure with $pStuffAcross 103 search targets.

Referring to FIGS. 5d-1 and 5d-2, a more detailed description of processing which an embodiment of getAllMarkersOnNets 303 performs in processing segment 503 is shown. In FIGS. 5d-1, at processing segment 601, a loop for scanning each cell which is listed in the macro data structure 137 is initiated. The loop is driven in processing segment 601 by loading the cell name in macro 137 then proceeding to processing segment 605 if a cell name was successfully parsed, otherwise, processing returns to processing segment 503 in FIGS. 5a-1. At processing segment 605, getAllMarkersOnNets 303 checks to see if the data stored in $sType 101 indicates if a net or a mark (model and port combination stored in $pAcrossStuff 107) is being searched for.

If a mark is stored in the $sType 101 data structure, then processing segment 607 executes, which is a loop through each $markCell 207 element that is in the $pStuffAcross 103 data structure. In processing segment 607, getAllMarkers OnNets 303 will select another $markCell 207 (a model from $pStuffAcross 103) if another unselected model exists. Once a $markCell 207 is found, then in processing segment 609, getAllMarkersOnNets 303 seeks to find a $childInst 209 (e.g., child instance "I1" 653 in FIGS. 5d-3) for the $markCell (e.g., FIGS. 5d-3, CellC 651) selected in processing segment 607. In other words, the segment 609 loop checks each instance of the cell which was selected in segment 607 that is listed in the $pStuffAcross 103. If a child instance (e.g., FIG. 5d-3, 653) is found for a selected $markCell 207 (e.g., FIGS. 5d-3, cell 651) in segment 609, then getAllMarkersOnNets 303 executes a loop which selects a port e.g., FIGS. 5d-3, port A 657, on the cell which is stored in $markCell 207 (e.g., FIGS. 5d-3, CellC 651) and which is listed in $pStuffAcross (e.g., port A 657 and cell CellC 651).

Referring to FIGS. 5d-2, at processing segment 611, getAllMarkersOnNets 303 will loop through a port so that all ports are examined which are associated with a cell stored in $markCell 207 and are listed as associated with a model (cell) and port in $pStuffAcross 103, saving each selected port in the $markChildPort 211 data structure one port at a time as the loop progresses. When a port is found, then getAllMarkersOnNets 303 will determine the net ($thisNet 221) which the currently selected $markChildPort 211 connects to, at processing segment 613. For example, referring to FIGS. 5d-3, $markChildPort 211 stores port A 657 that is connected to net1 655 which is stored in data structure $thisNet 221; both child port A 657 and net1 655 are associated with CellC 651.

At processing segment 615, getAllMarkersOnNets 303 will add an entry to $pMarkedNets (i.e., a pointer to % MarkedNets 161) under the current $sMarkKey 105 header which is stored in % MarkedNets 161. The entry stored at processing segment 615 includes an instance name for the instance (child instance) of $markCell 207 (e.g., FIGS. 5d-3, CellC 651) that was selected in segment 607, then processing returns to processing segment 611. At processing segment 611, if another port was not found for the $markCell 207 which was listed in $pStuffAcross 103, then processing returns to segment 609 in FIGS. 5d-1.

Referring to FIGS. 5d-1, if another child instances is not found that is also a marked cell, then processing returns to processing segment 607. If another marked cell is not found for $markCell 207, then processing returns to processing segment 601. If getAllMarkersOnNets 303 determines at processing segment 601 that there is another cell, then processing segment 605 will check to determine what kind of search targets are being scanned for in the netlist $pNL 131, e.g., a "mark" which is stored in $sType 101. If the data "net" is stored in $sType 101, then processing segment 619 will pass control to processing segment 621. At processing segment 621, getAllMarkersOnNets 303 will determine if another net name (i.e., a search target) exists in $pStuffAcross 103 and then store that selected net name in $markNet 219. Processing segment 621 is a loop which loops through each net name in the $pStuffAcross hash 103 one at a time, thereby examining all the nets which are associated with the cell or model referenced in the current $thisCell 203 and also listed in $pStuffAcross 103. (e.g., CellC 651, net A 657) It should be noted that a port and a net may have the same name inside a cell. All ports are nets, but not all nets are necessarily ports. For example, referring to FIGS. 5e-3, in CellB, net2 747 between the two resistors R1 745 and R2 749 is not a port of cellB 731. Rather, net2 747 is an internal net, not a port.

Referring to FIGS. 5d-2, at processing segment 623, getAllMarkersOnNets 303 checks to determine if a currently selected $markNet 219 is located within the cell which is currently referenced in $thisCell 203. If the net referenced in $markNet 219 is not located within the currently selected $thisCell 203, then control is passed back to processing segment 621 (FIGS. 5d-1) which determines if another $markNet 219 exists as discussed above. Otherwise, if a net referenced in $markNet 219, for example FIGS. 5d-3 net1 655, is found in the cell referenced in $thisCell 203, for example FIGS. 5d-3 cellB 654, then an entry is added to the % MarkedNets 161 data structure under the current $sMarkKey 105 header (FIG. 8a, M_BNV 951) at processing segment 625. The entry added in processing segment 625 underneath the $sMarkKey 105 in % MarkedNets 161 includes $thisCell 203 (e.g., FIG. 8a, CellB 959) and $markNet 219 (e.g., FIG. 8a, Vbb 961). It should be noted here that Vbb is a global net which does not appear in the schematics, e.g., FIG. 6. For example, when a transistor is placed in a schematic, every cell has a Vbb net which is tied to every transistor, thus the Vbb ports or nets are not included in schematics such as FIG. 6 because each and every cell has a Vbb, therefore it is understood that each and every transistor in any cell has Vbb and therefore it is not necessary to list the Vbb nets, ports or connections to transistors, however, Vbb will be included in the netlist $pNL 131 properly.

Referring to FIGS. 5d-a1, once the processing segment 625 entries are made in % MarkedNets 161, then getAllMarkersOnNets 303 then returns to processing segment 621 and then performs another loop iteration by checking for another $markNet 219 as specified in processing segment 621 above. If another net name (i.e., a search target) is not found in the $pStuffAcross 103 data structure to store in $markNet 219, then control is passed back to processing segment 601. At processing segment 601, if it is determined that another cell exists which is listed in the macro 137 data structure which has not been previously selected, then the flow of processing begins to proceed through segments 605 through 615 or 605 through 625 as described herein. Otherwise, if it is determined that no cells which have not been selected exist in macro 137, then getAllMarkersOnNets 303 terminates and control is passed back to processing segment 503 in FIGS. 5a-1, at which point, processing continues at processing segment 505.

Figures 1, 5A:
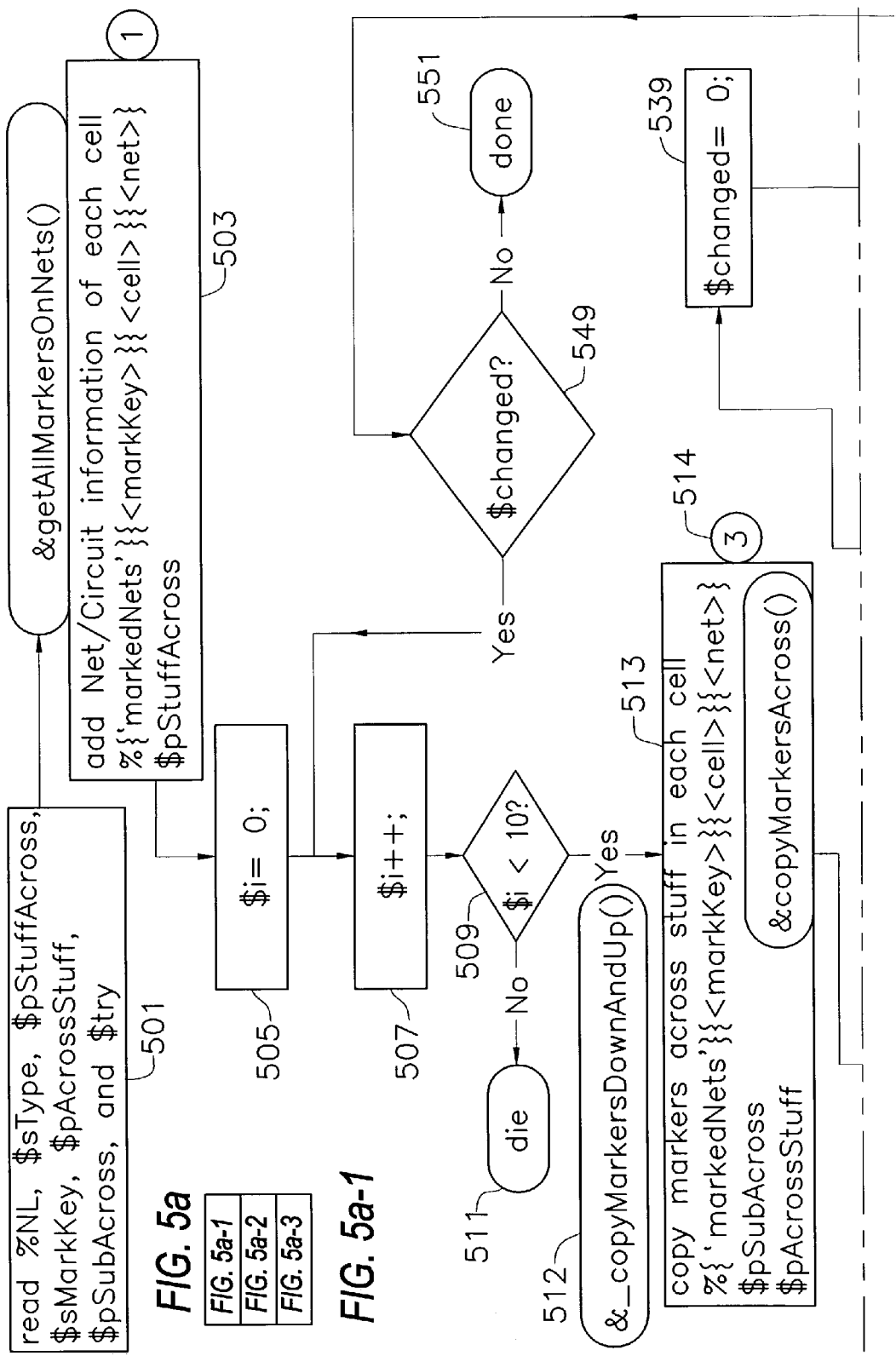
Figures 2, 5A:
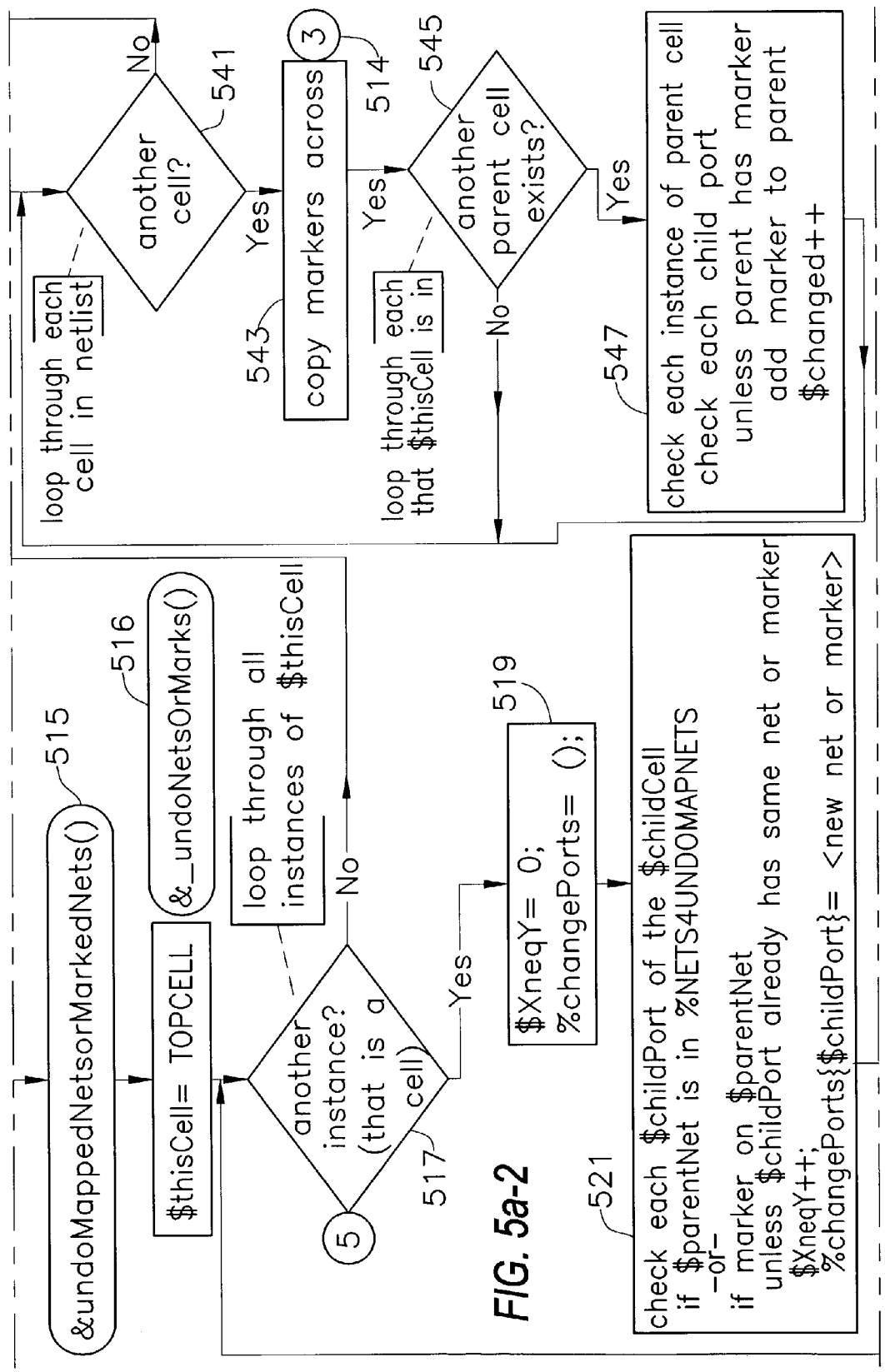
Figures 3, 5A:
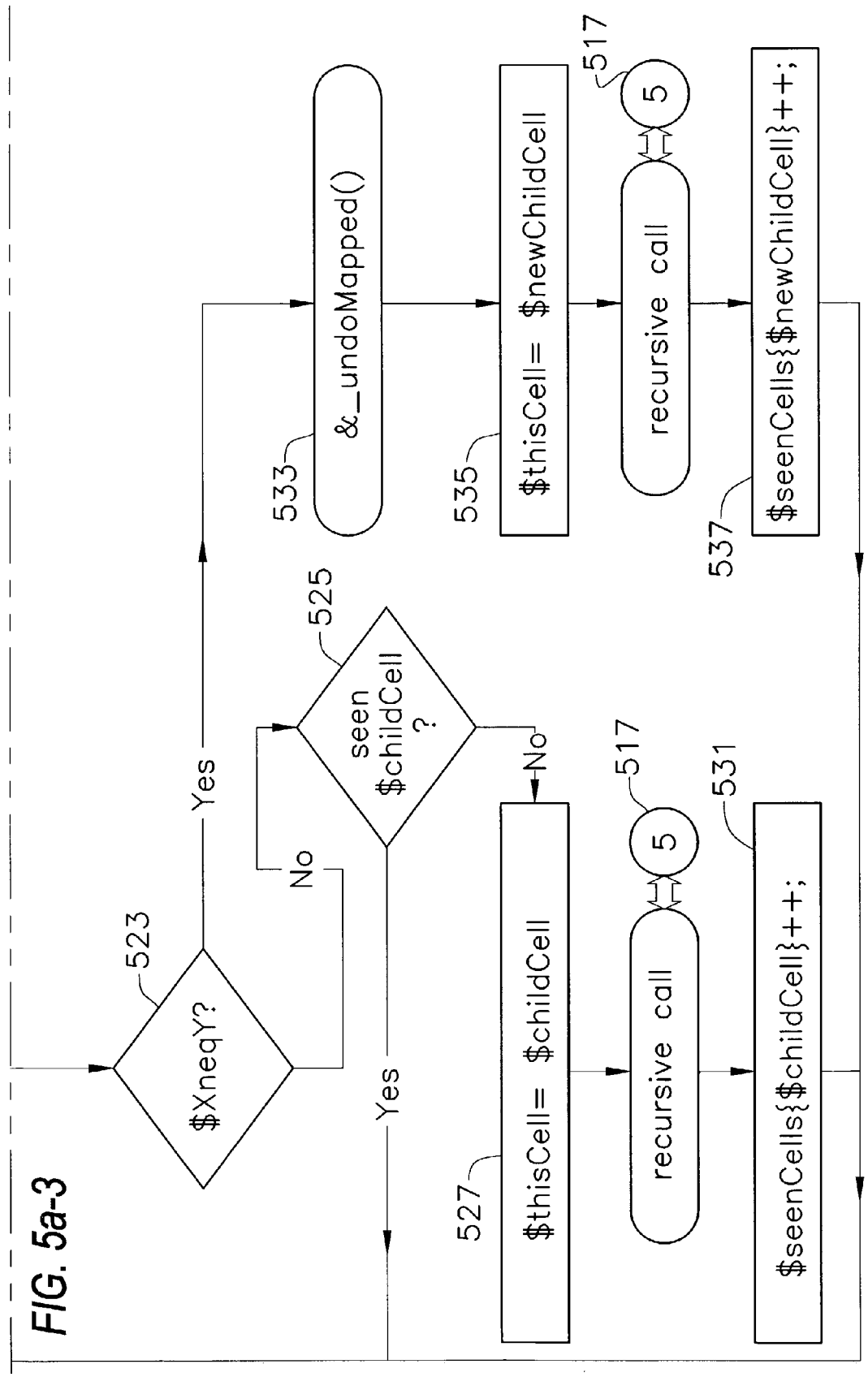

Referring to FIGS. 5a-1, next, a loop control and fault handling submodule 311 in module 303 (FIG. 4a) is executed, which ensures the system will not perform unnecessary iterations, where a temporary counter variable in module 311 is set to zero at processing segment 505. Next, at processing segment 507, the loop control counter in module 311 is incremented. At processing segment 509 a processing segment in module 311 checks to see if the counter in module 311 is equal to a maximum loop value, in this embodiment "10". If the counter is equal to ten, then an error routine executes which terminates processing and performs fault handling, such as displaying an error message on screen 67 at processing segment 511. If the counter value is less than the maximum loop value, e.g., ten, (within getAllMarkersOnNets 303), _copyMarkersDownAndUp 319 is called at processing segment 512 which then calls the copyMarkersAcross 341 module which will populate the % MarkedNets 161 data structure by using models and ports listed in $pAcrossStuff 107 (and $pSubAcross 109 if an override or special case function is defined) which is further explained in detail in FIGS. 5e-1, 5e-2 and 5e-3.

Figures 2, 5B:
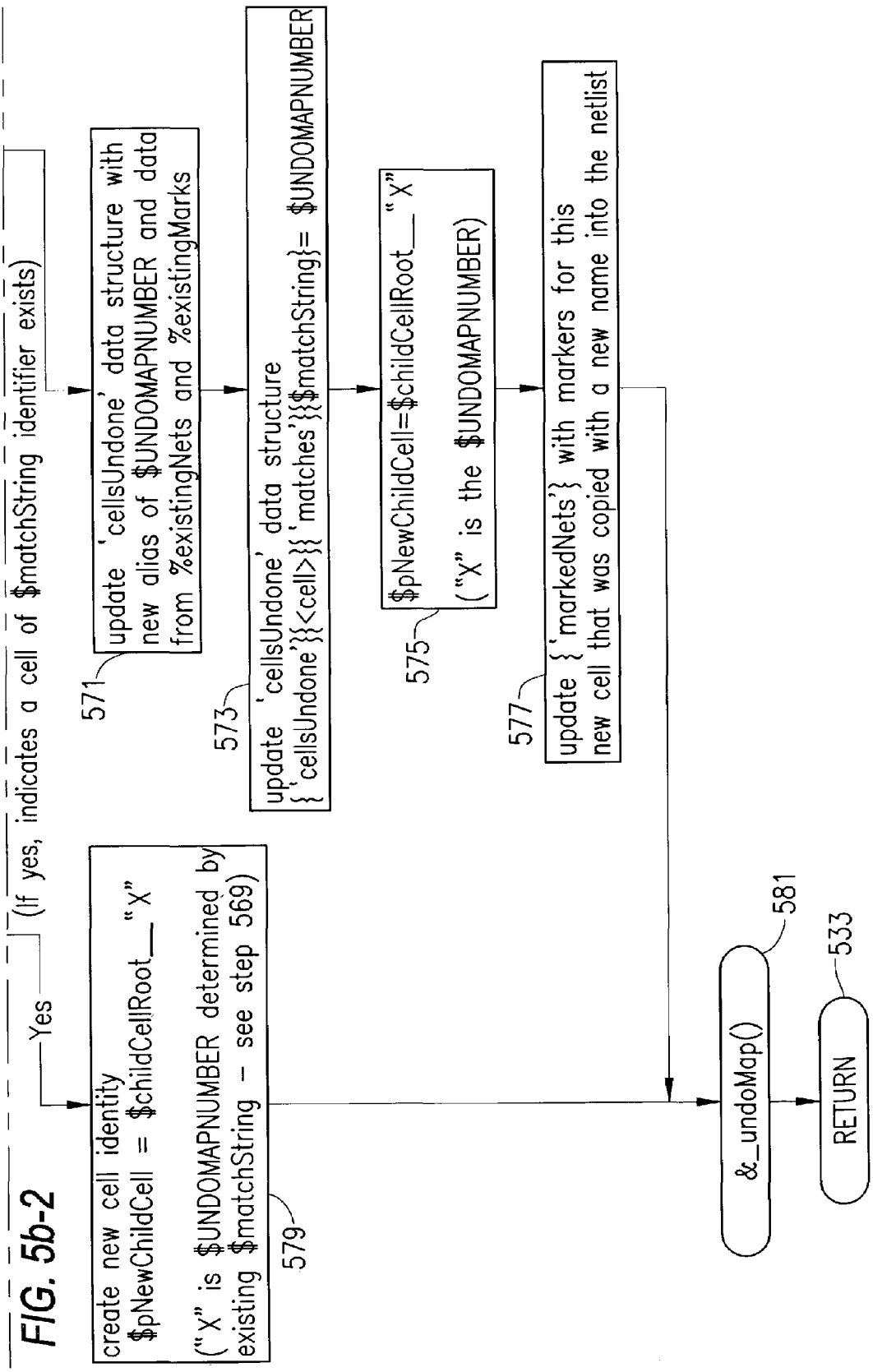
Figure 5C:
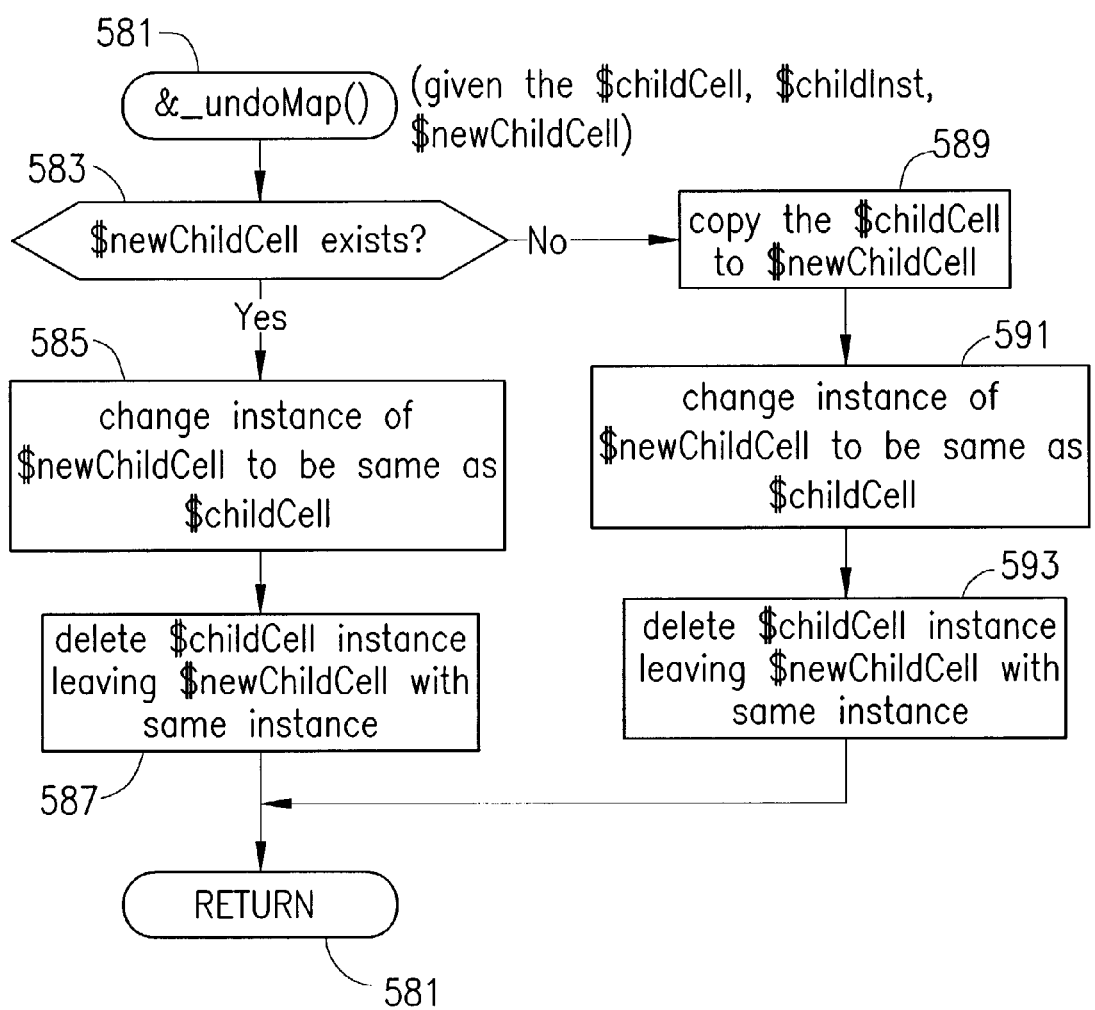
FIG. 5c shows a portion of a processing sequence in accordance with an exemplary embodiment of the invention.
Figures 1, 2, 5D:
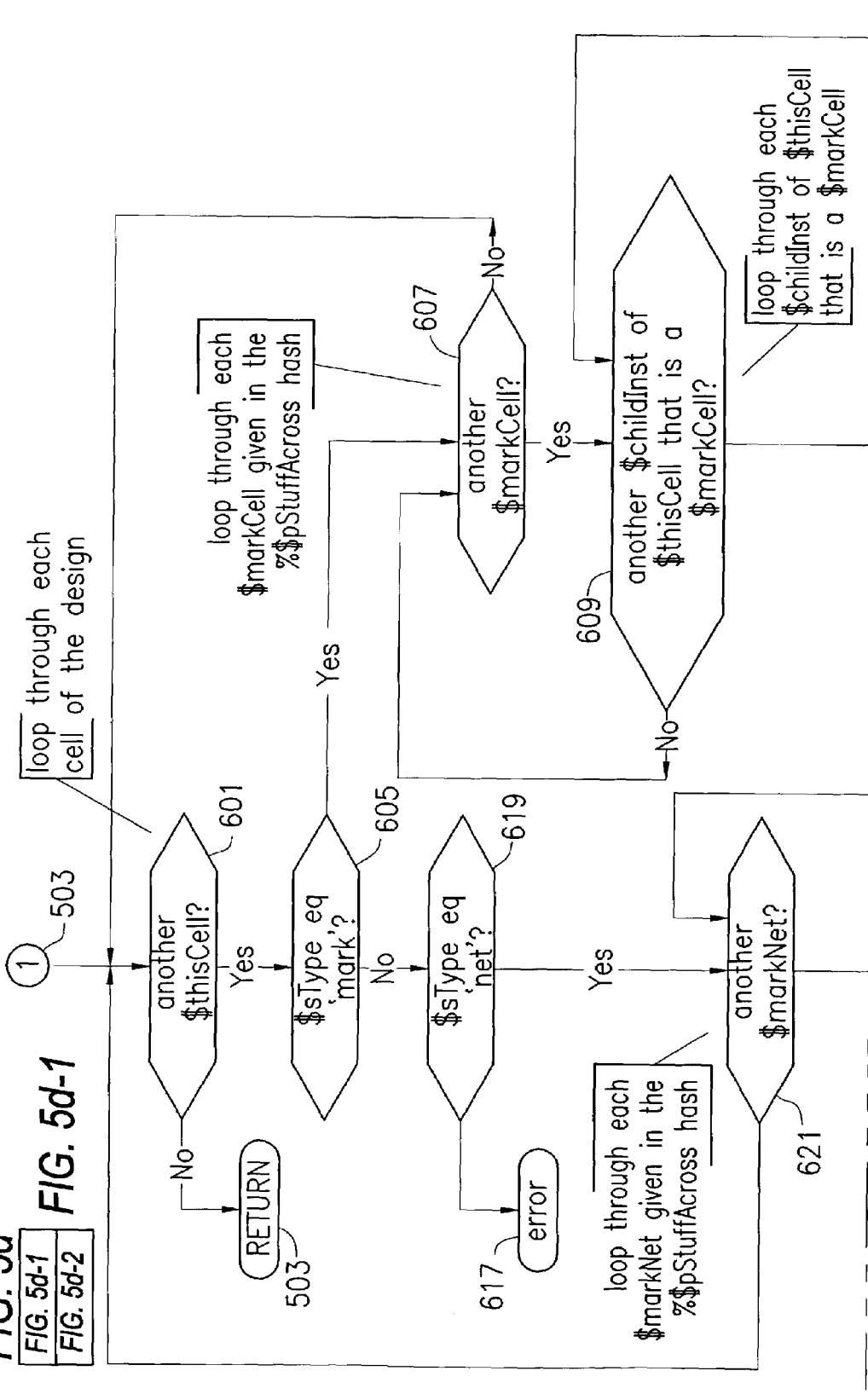
Figures 2, 5D:
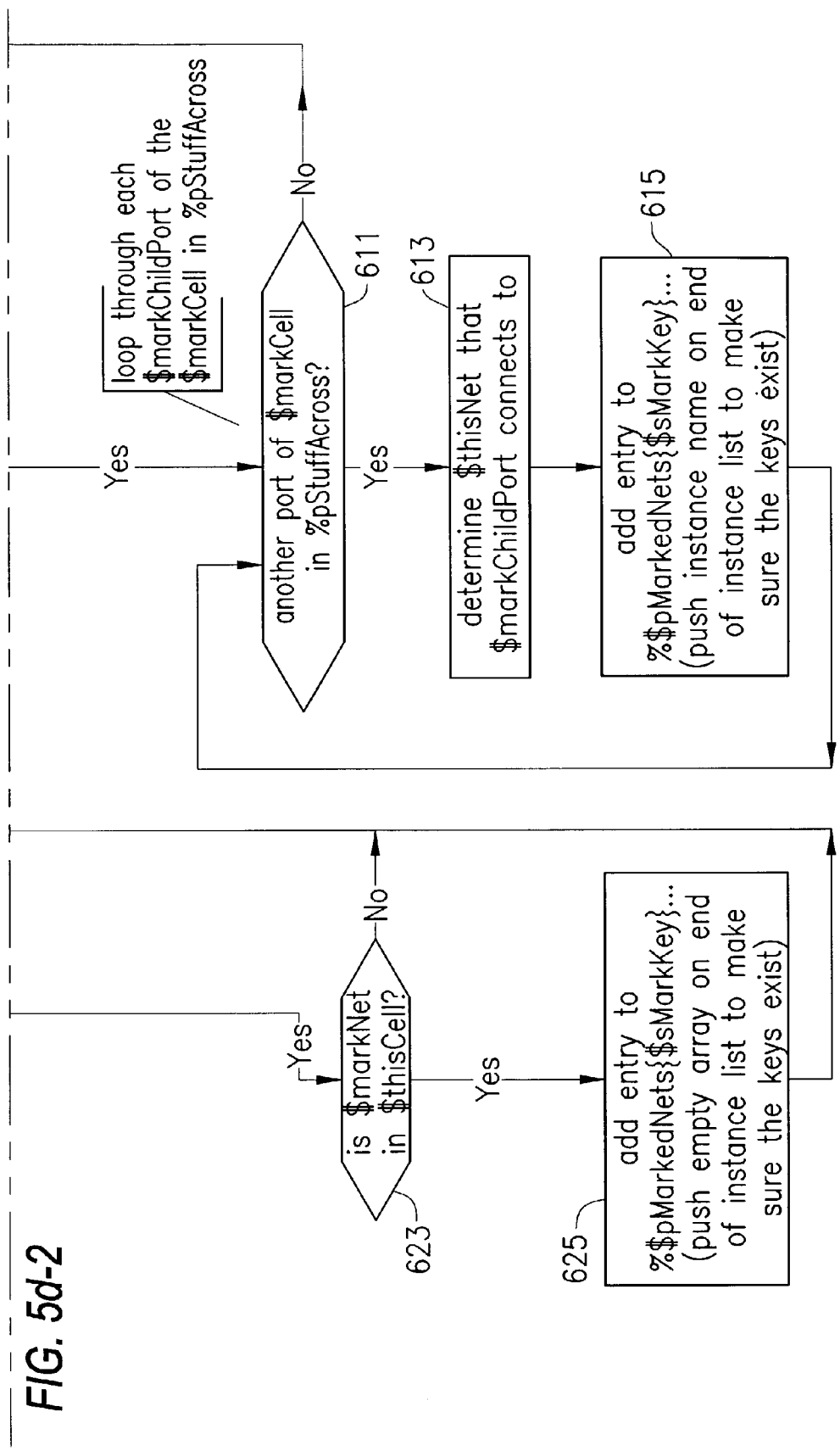
Figures 3, 5D:
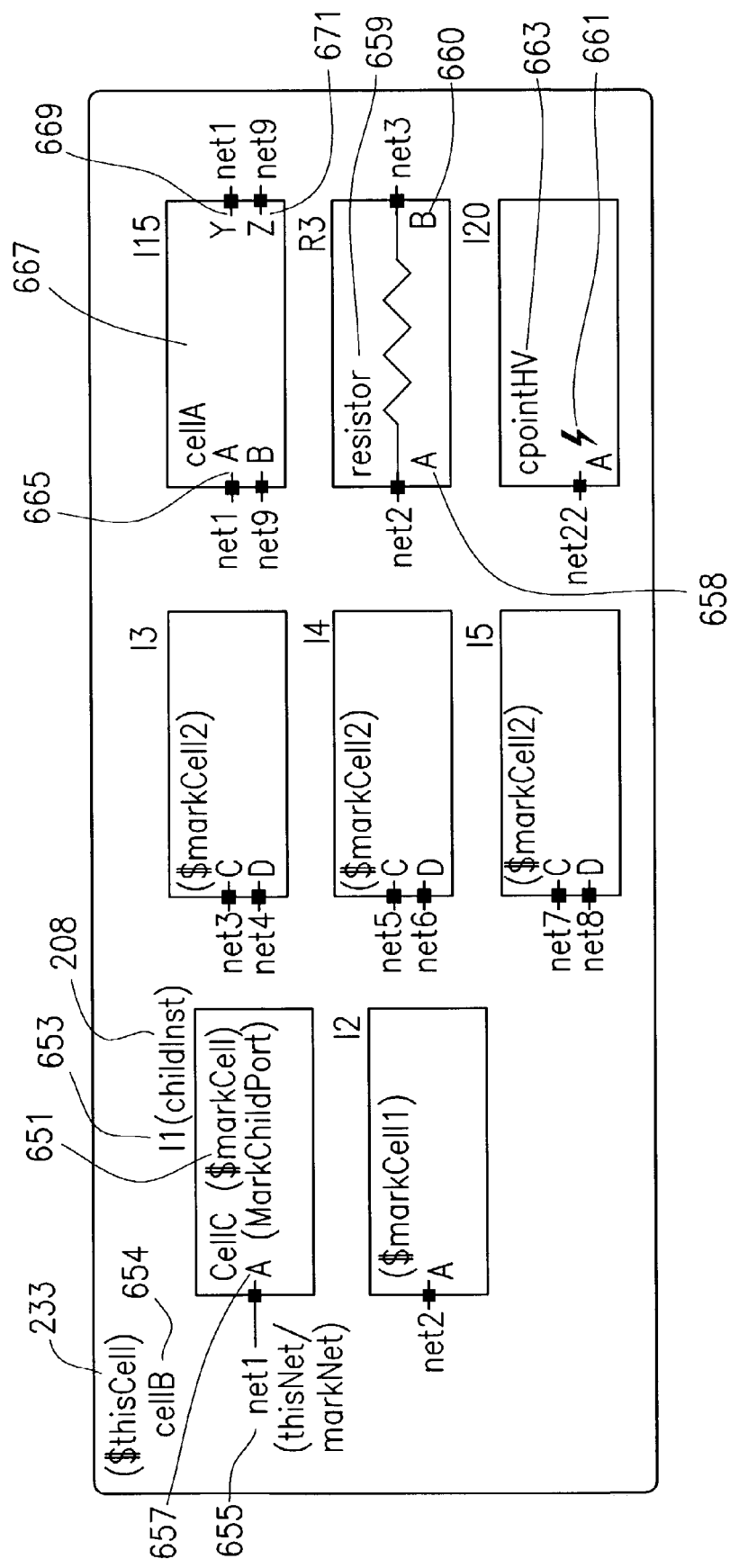
Figures 1, 5E:
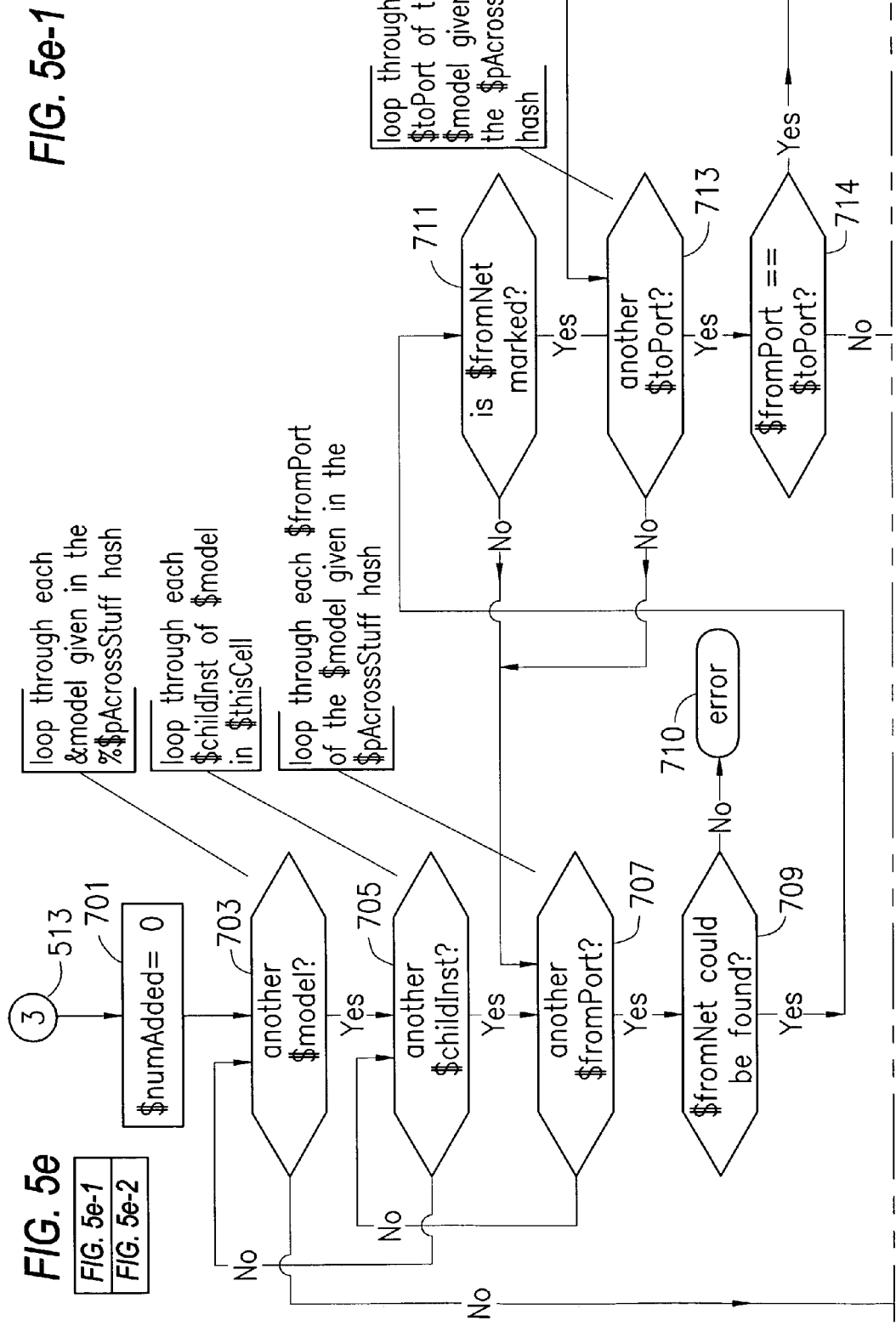
Figures 2, 5E:
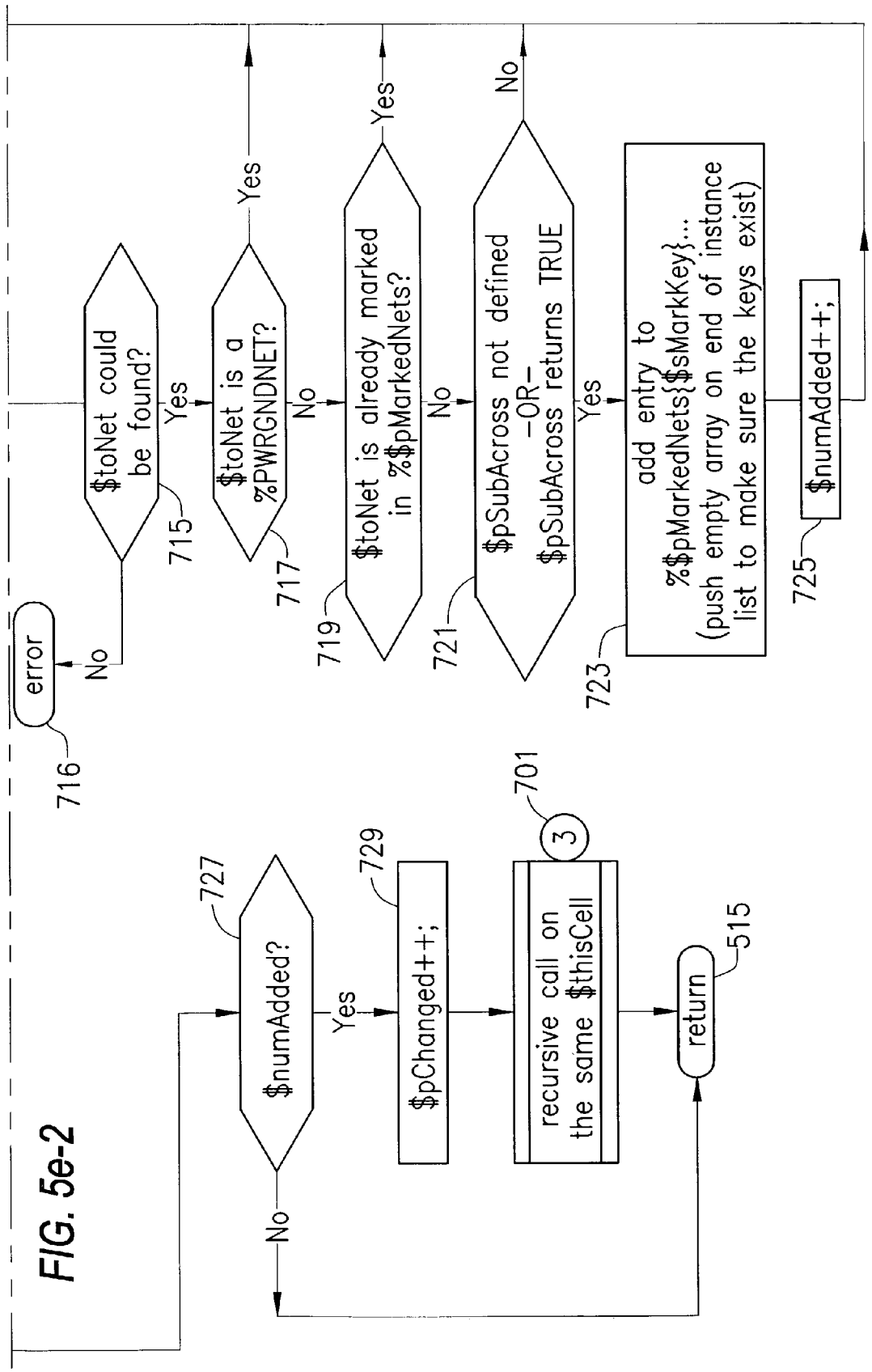
Figures 3, 5E:
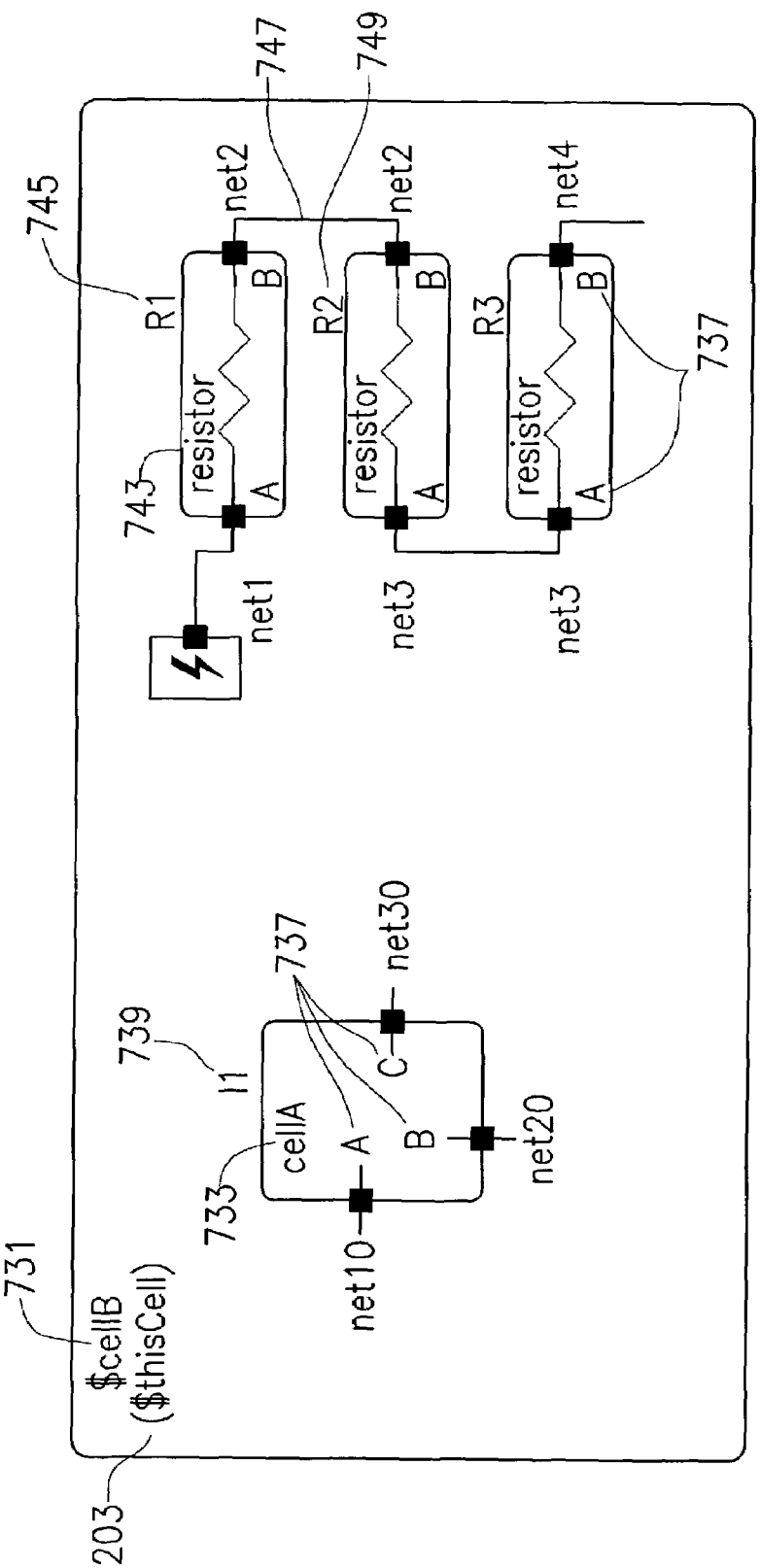

Referring to FIGS. 5e-1 and 5e-2, the operation of the copyMarkersAcross 341 module is shown. At processing segment 701 in FIGS. 5e-1, $numAdded 263 is initialized to zero. Next, at processing segment 703, the copyMarkersAcross module 341 initiates loop processing which will select a cell model from the $Model data structure 261 (a copy of % Model 135) which is also listed in the $pAcrossStuff 107 data structure (each matching model will be selected one at a time). For example, referring to FIGS. 5e-3, cellA 733 will be the model which is selected within the cellB model 731.

If a cell model is found that is listed in the $pAcrossStuff 107 data structure, then the copyMarkersAcross 341 module then searches and selects a child instance ($childInst 251) within the model selected in the preceding processing segment from the $Model 259 data structure (each instance will be selected one at a time for each selected model) at processing segment 705. For example, referring to FIGS. 5e-3, cellA, instance zero (I1) 739 will be the $childInst 251 which will be selected at this iteration of processing segment 705.

Next at processing segment 707, the copyMarkersAcross 341 module will select a "from" port on the selected model (e.g., FIGS. 5e-3 cellA 733) at processing segment 703 (each port which is listed in $pAcrossStuff 107 will be selected one at a time in the loop). Referring to FIGS. 5e-3, ports A, B and C 737 are shown in cellA 733. The selection in processing segment 703 will be dependent on what ports are listed with the model (e.g., CellA 733) in $pAcrossStuff 107. For example, if only port A and C are listed in $pAcrossStuff 107, then cell B will not be selected. The term "fromPort" and "toPort" refer to the relationship between a selected port and the other ports which are not selected but are also listed in the $pAcrossStuff 107 data structure as being associated with a target model and port combination.

Assuming all three ports in FIGS. 5e-3, CellA 733 are listed in $pAcrossStuff 107, in another example loop starting with A as the $fromPort data (FIG. 3c, 253), B and C are stored in the $toPorts 257 data structure for first the iteration. In the second iteration, port "B" is stored in the $fromPort data structure 253, and "A" and "C" is stored in the $toPorts 257 data structure. For every iteration of $fromPorts 253, you have to look at all the other ports that were specified in the $pAcrossStuff 107 data structure.

Next in processing segment 709, a subroutine (not pictured) called netsOnInstPort is called which gives the nets in the $fromPort 253 selected in processing segment 707. NetsOnInstPorts accepts as inputs the netlist $pNL 131, $thisCell 233, $childInst 251 and $fromPort 253. As mentioned above, the port stored in $fromPort 253 is located in the currently selected $childInst 251 which is selected one at a time for a sequenced loop through all instances in the currently selected % Model 135, thereby scanning all ports on all selected instances. If no $fromNet 755 is selected, then an error handling routine is executed, e.g., a message is displayed at processing segment 710. At processing segment 711, the copyMarkersAcross 341 module checks to see if the selected net stored in $fromNet 253 is marked in the % MarkedNets 161 data structure. If the $fromNet 255 data is not marked in % MarkedNets 161, then processing returns to processing segment 707 and continues from there.

If $fromNet 255 data is listed in % MarkedNets 161, then in processing segment 713 the copyMarkersAcross module 341 begins a loop processing by selecting each $toPort 257 of the models specified in the $pAcrossStuff 107 data structure and stored in the % Model 135 data structure. If the port in $toPort 257 is not listed in $pAcrossStuff 107, then control returns to processing segment 707 and processing commences from that point.

Referring to FIGS. 5e-2, if the port in $toPort 257 is listed in $pAcrossStuff 107, then processing segment 714 performs a check to see if the $fromPort 253 is the same as the $toPort 257 data. If yes, then loop control returns to processing segment 713 and commences from there. If no, then the copyMarkersAcross 341 module checks to see if a $toNet 259 exists in the selected $toPort 257 on the selected $childInst 251 in the selected cell in $thisCell 233 at processing segment 715.

If there is no $toNet 259 found at processing segment 715, then an error handling routine executes at processing segment 716. Otherwise, the copyMarkersAcross 341 module checks to see if a special case is met, in this case if the net data stored in $toNet 259 matches data stored in an input data structure, $PWRGNDNET (power or ground net) (not pictured). If a match is found, then loop control returns to processing segment 713 (FIGS. 5e-1) and continues from there. Otherwise, copyMarkersAcross 341 checks to determine if the selected net in $toNet 259 is found in % MarkedNets 161 associated with the $sMarkKey 105 data and $thisCell 233 at processing segment 719.

At processing sequence 719, copyMarkersAcross 3341 determines if the data in $toNet 259 is in % MarkedNets 161. If $toNet 259 data matches data in % MarkedNets 161, then control is returned to processing segment 713 (FIGS. 5e-1). If the data in $toNet 259 is not in % MarkedNets 161, then copyMarkersAcross 341 checks if a selected data from $pStuffAcross 103 is defined given input arguments $pN1 131, $thisCell 233, $childInst251, $model 261 at processing segment 721. If the result of processing segment 721 is false (not defined), then copyMarkersAcross 341 returns control to processing segment 713 (FIGS. 5e-1). If a true result (is defined) results at processing segment 721, or if the $pSubAcross 109 was not defined, then copyMarkersAcross 341 adds and entry to % MarkedNets 161 under the current $MarkKey 105 entry in % MarkedNets 161 at processing segment 723.

In this embodiment, an empty array notation will be added to the new entry in % MarkedNets 161 to ensure an entry is listed in % MarkedNets 161 even when no instance exist but the model exists to be included in % MarkedNets 161. (See FIG. 8a, where Vbb has an empty array entry 953 as contrasted to the cellTOP entry 955 (See FIG. 8b) which has an instance X0 of net IN2). Next, at processing segment 725, $numAdded 263 is incremented (which is used to indicate the process of copying across should run completely again) and processing returns to segment 713 in FIGS. 5e-1. When processing returns to segment 713 and there is not another $toPort 257 that exists in the currently selected $model 261, then control returns to segment 707.

Referring to FIGS. 5e-1, if there is not another $fromPort 253 to select at processing segment 707, then control returns to processing segment 705. At processing segment 705, if there is not another $childInst 251, then processing returns to processing segment 703. If another model listed in the $pAcrossStuff 107 data structure is not found, then control is passed to processing segment 727 (FIGS. 5e-2).

Referring to FIGS. 5e-2, processing segment 727 checks to see if $numAdded 263 has been incremented. If $numAdded 263 has been incremented, then the $pChanged 235 data structure (passed into copyMarkersAcross 341 from _copyMarkersDownAndUp 319) is incremented at processing segment 729, then processing recursively returns to processing segment 701 and continues execution from there. Processing segment 730 is a recursive call to copyMarkersAcross 341, which commences at processing segment 701. Recursive calls will continue until $numAdded 263 does not indicate a change that was made at processing segment 723. When the last recursive call completes or $numAdded 263 does not indicate being incremented at processing segment 727, then the copyMarkersAcross 341 subroutine completes processing and returns control to processing segment 513 in FIGS. 5a-1 when then continues to processing segment 515.

Referring to FIGS. 5a-2, next, the undoMappedNetsOrMarkedNets 321 is called which then creates $pSeenCells 273 at processing segment 515. Next in processing segment 516, _undoNetsOrMarks 331 module is called with initialization arguments at processing segment 516. The initialization arguments for _undoNetsOrMarks 331 indicate a starting point (topcell in this embodiment). The _undoNetsOrMarks 331 module checks to determine if the next instance in the circuit representation is a child instance below the starting point in the hierarchy at processing segment 517. The _undoNetOrMarks 331 module will begin to loop through all instances of the cell stored in $thisCell (FIG. 3d, 287). If there is an instance to select, then at processing segment 519, then the $XneqY 279 data structure is initialized to zero and the % changePorts data structure (FIG. 3d, 281) is initialized as an empty hash. Next, the _undoNetsOrMarks 331 data structure will check each child port storing it in $childPort (FIG. 3d, 285) using a loop which checks all ports on the $childCell (FIG. 3d, 284) to determine if a condition is met at processing segment 521.

Whether the $parentNet 289 is in % NETS4UNDOMAPNETS data structure (not pictured and which is a user input variable) is a first condition which can trigger processing segment 521. Another condition which may be met in processing segment 521 is whether there is a search target from $pStuffAcross 103 or $pAcrossStuff 107 that is included on the $parentNet 289 data structure, unless the $childPort 285 already has the same net or marker. If either condition is met, then the % changePorts 281 data structure is updated with a child port and the $parentNet 289 or marker (e.g., $sMarkKey 105) (e.g., referring to FIG. 1, childPort is "A2" 10, $parentNet 289 is "Vcc" 9 for a net; childPort is "A3" 14, $sMarkKey 105 is M_HV for a marker) determined in processing segment 521. In other words, _undoNetsOrMarks 331 looks at the ports of the child cell, fills in the % changePorts 281 data structure with $childPort data 285 showing the ports on the child instance that are marked differently in % MarkedNets 161 than the parent in the netlist $pNL 131 based upon a comparison of the net and/or marker data in the % MarkedNets 161 data structure. If a net, then the comparison is between the netname for parent port versus netname for childport e.g., FIG. 1, Vcc 9 for parent port and A2 (FIG. 1, 10) for the child port. If the comparison is based on marks, the system checks to see if the parent net is marked within % MarkedNets 161 data structure, then if it is marked, then the system will move on to the next port of the child cell. If the system finds a marked net on the next port of the current cell being checked is listed as marked in the % MarkedNets 161 data structure, then the system will look to see if the net into the child port stored in $childport 285 of the child instance connected to the currently selected port is listed in the % MarkedNets 161 data structure. If the child port netname is listed in % MarkedNets 161, then the system will make an entry in % changePorts 281 data structure for the selected name. If either of the conditions are met, the change data, $XneqY, (FIG. 3d, 279) indicator will be updated (incremented in this embodiment) to complete the function of processing segment 521.

Referring to FIGS. 5a-3, in processing segment 523 the system will check the change data, $XneqY (FIG. 3d, 279), to see if a change has been made. If there is a change indicated in the changed data (i.e., $XneqY, FIG. 3d, 279), then the _undoMapped 351 module is called.

Referring to FIGS. 5b-1, at processing segment 561 the _undoMapped 351 module checks to see the selected $childCell 284 has already been unmapped and listed into the % CellsUndone data structure 163. If it has, then _undoMapped 351 copies the unmapped data from % CellsUndone 163 if it exists, into the % existingPins 296 (FIG. 3d) and % existingNets 297 and % existingMarks 298 data structures from the % CellsUndone 163 data pointed to by the root cell name and alias number parsed from the actual cell name at processing segment 562. For example, if $childCell 284, containing the root cell "CellA" has been unmapped, then % CellsUndone 163 will have an entry of "CellA" with a list of aliases for that cell such as "1, 2, 3", where "1", "2" or "3" are examples of the alias number used to identify and access the stored % CellsUndone 161 data which corresponds to a given cell root name. Next, at processing segment 563, _undoMapped 351 prepares information about the port mapping between the currently selected cell and the cell with ports which were annotated in % changePorts 281 thereby storing current pins, nets and marks information to % existingPins 296, % existingNets 297 and % existingMarks 298.

If the data has not already been unmapped at processing segment 561, then processing moves from processing segment 561 to processing segment 565. At processing segment 565, the _undoMapped 351 module then creates a % matchString 295 identity representing the existing net(s) and marks on the ports of the $childCell 284 based upon data in % existingPins 296, % existingNets 297, % existingMarks 298 (e.g., FIG. 7 853).

MatchString data stored in % matchString 295 is based on a cell name, which is used to create the new cell identity by association with the child cell root name of the child cell with the port(s) listed in the % changePorts 281 (FIG. 3d) data structure. At processing segment 567, the _undoMapped 351 module checks to determine if a previously stored % matchString 295 data exists which matches the attributes of the selected cell including the attributes determined in step 565.

Referring to FIGS. 5b-2, if a match is found in processing segment 567, then in processing segment 579 a new cell identity is created with the previously stored % matchString 295 data which matches the attributes found in step 565 appended to the cell root identity, e.g., CellB becomes CellB_5, where "5" is a previously stored reference to a set of stored attributes which describe a cell or circuit representation. Next, at processing segment 581, the _undoMap 361 module is called (discussed below).

Referring back to FIGS. 5b-1, processing segment 567, if a match is not found between attributes found in processing segment 565 and a stored % matchString 295 data in the % CellsUndone 163 data structure, then the $UndoMapNumber 181 data structure is incremented.

Referring to FIGS. 5b-2, at processing segment 571, the _undoMapped 351 module updates the % CellsUndone 163 data structure with a new alias of $UndoMapNumber 181 and data from % existingNets 297 and % existingMarks 298. At processing segment 573, _undoMapped 351 adds an entry to the % CellsUndone 163 data structure to include the new % matchString 295 data (e.g., FIG. 7 853) which includes $childCellRoot 299, matches (not pictured; e.g., see FIG. 7; stored in % CellsUndone 163), % matchString 295 and $UndoMapNumber 181 data. $ChildCellRoot 299 is the child cell name without any mapping text appended. The data in the % CellsUndone 163 is organized around the child cell root (cell type) name.

At processing segment 575, _undoMapped 351 sets the variable $pNewChildCell (a pointer to $newChildCell 291) to the new cell name (e.g., child cell root name with appended changed attribute identifier data, e.g., "CellA_5"). At processing segment 577, _undoMapped 351 adds a new cell entry to % MarkedNets data structure. Next, at processing segment 581, the _undoMap 361 module is called by the _undoMapped 351 module.

Referring to FIG. 5c, this embodiment of the _undoMap 361 module creates or copies the new cell data and stores the cell data in the netlist $pNL data structure 131, with the $pNewChildCell name, in all places required to establish the new cell as a structure in the netlist $pNL 131 (e.g., in Macro, 137, % Inst 133, % Model 135, % Ports 139). At processing segment 583, _undoMap 361 checks to determine if a standard cell (i.e., macro 137) has been created in the netlist $pNL 131. If a cell corresponding to the $newChildCell 291 was not listed in the netlist $pNL 131, then continue to processing segment 589. At processing segment 589, the $newChildCell 291 data is created from a copy of the $childCell 284. Continuing to processing segment 591, the instance of the copied cell is changed. Continuing to 593, the old instance is deleted leaving only the new cell name with the old instance name (e.g., FIG. 6 cellB_6, I21 805 has replaced cellB I21 (15) in FIG. 1). Then return to processing segment 581. At processing segment 583, if a cell corresponding to the $newChildCell 291 data was listed in the netlist $pNL 131, then continue to processing segment 585, change instance done in processing segment 591, continue to processing segment 587, delete as in processing segment 593, then return to processing segment 581.

From this point, the _undoMap 361 will next return back to _undoMapped 351 at processing segment 581 (FIGS. 5b-2), then _undoMapped 351 returns to _undoNetsOrMarks 331 at processing segment 533 in FIGS. 5a-3 then continues to processing segment 535. At processing segment 535, the data stored in $newChildCell 291 is loaded into $thisCell 287. Next, there will be a recursive call back to _undoNetsOrMarks 331 with the $newChildCell 291 name as the starting point for the next scan to look at all instances in $newChildCell 291 at processing segment 517 in FIGS. 5a-2. The process from processing segment 517 will then proceed. After processing which results from the recursive call to processing segment 517 concludes, then processing segment 537 executes which increment the $pSeenCells 273 data structure which is used in processing segment 525 to avoid redundant processing of the $newChildCell 291 or cells in general. Next, processing returns from this point to processing segment 517 and proceeds from there.

Returning back to processing segment 523 in FIGS. 5a-3, if $XneqY 279 does not indicate a changed attribute from processing segment 521, then the _undoNetsOrMarks 331 module checks to see if the currently selected child cell which is being scanned is listed in $pSeenCell 273 at processing segment 525. If the selected child cell is listed in $pSeenCell 272, then processing control returns to processing segment 517 in FIGS. 5a-2 and recommences from that point.

Referring to FIGS. 5a-3, if the selected child cell is not listed in $pSeenCells 273, then the $childCell 284 data is copied into $thisCell 287 at processing segment 527. Processing segment 527 allows _undoNetsOrMarks 331, when it makes the recursive call to processing segment 517, to move downwards through the hierarchy as a higher level cell identity is replaced with a lower level cell identity (e.g., FIG. 1 TOP 2 is replaced by CellA 3 for scanning). Next, recursive calls are made to processing segment 517 where processing recommences as described herein. When recursive processing is concluded, then control returns and proceeds to processing segment 531. In processing segment 531, the $pSeenCells 273 entry for the child cell is incremented as in processing segment 537. Next, processing returns to processing segment 517 and it commences from that point.

Referring to FIGS. 5a-2, at processing segment 517, at the point where there is no additional cell instances found in $thisCell 287 then processing segment 539 (FIGS. 5a-1) executes which initializes the $changed 235 data structure to zero. In other words, scanning of circuit elements has proceeded to the bottom of the section of the netlist $pNL 131 it was scanning until it reached the point in the netlist $pNL 131 where only primitives existed (that is, no cells existed) then was required to traverse back up the netlist $pNL 131 hierarchy to find another cell, if one exists, to scan. Referring to FIGS. 5a-1, at processing segment 539 control is passed to back to the _copyMarkersDownandUp 319 module.

Referring to FIGS. 5a-2, at processing segment 541, _copyMarkersDownandUp 319 checks to determine if another cell is available for scanning at within the % Order 138 data structure which has not been scanned. If there is another cell which has not been scanned in % Order 138, then at processing segment 543 the copyMarkersAcross 341 module is called (at processing segment 514) and processing commences as described above. When processing has completed by the copyMarkersAcross 341 module, then copyMarkersDownandUp 319 checks to determine if another parent cell exists in the netlist $nPL 131 data structure at processing segment 545. If another parent cell does not exist, then processing returns to processing segment 541. If another parent cell does exist, then at processing segment 547, _copyMarkersDownAndUp 319 checks an instance of the selected parent cell (in $thisCell 233), checks each child port of the selected instance of the parent cell, then unless the parent has a marker that the child port had, then it adds a marker to the parent in the netlist (in % MarkedNets 161) and increments the $changed 235 variable. Processing segment 547 is done for each instance of the selected parent cell and, when done, returns control to processing segment 541.

Next, at processing segment 541, if the _copyMarkersDownandUp 319 module determines that no additional cells are to be found in the % Order 138 data structure which have not been scanned, then processing segment 549 (FIGS. 5a-1) is executed which checks the $changed 235 data structure to determine if a marker was copied up to a parent in the % MarkedNets 161 thereby indicating information must be distributed around the netlist to ensure all verification data is distributed and remapped cells are properly described. If yes, then processing continues as processing segment 507 in FIGS. 5a-1 as described herein. Otherwise, if the $changed 235 data structure does not indicate any changes were made in the % MarkedNets 161 data structure, then processing is completed at processing segment at processing segment 551 and all accumulated useful data is stored or returned to the program or user who called the remapping program 301 or any of the separate modules within the remapping program 301 (FIG. 3d).

Referring to FIG. 6, an exemplary schematic is shown which indicates some of the changes which an exemplary embodiment of the invention will make to a netlist. A number of changes have been made such as CellA_5 801 has replaced cellA 3 (FIG. 1), vcc! 803 has replaced ports A2 and B1 8 (FIG. 1), cellB_6 805 has replaced cellB 5 (FIG. 1), HV marker 807 has been added to net/port A3 14, cellA_7 has replaced cellA 13 (FIG. 1), cellB_8 811 has replaced cellB 15 (FIG. 1), CGND 813 has replaced ports/nets A1 19 and B1 25 (FIG. 1), cellB_6 815 has replaced cellB 27 and vcc! 817 has replaced ports/nets A2 23 and B1 29 (FIG. 1).

Referring to FIG. 7, an exemplary output of an embodiment of the invention is shown. In particular, FIG. 7 shows an exemplary output showing a portion of the % cellsUndone 163 data structure. The output shows a cellsUndone header 161' with a variety of data discussed above.

Referring to FIG. 8a and FIG. 8b, an exemplary output of an embodiment of the invention is shown. In particular, FIG. 8a and FIG. 8b show elements of the % MarkedNets 161 data structure under a header 161' with data discussed above.

Referring to FIG. 9, an exemplary output report of an embodiment of the invention is shown. In this example, data concerning the verification data distribution and analysis is produced including number of markers 971 and cells unmapped 973.

A number of steps can be accomplished in different sequences such that the functions of the invention may be carried out. Data structures such as hash table keys can also be arranged differently or a different form of organization. Any programming language may be used to implement the function of the invention including Perl, Lisp, C, C++, C# or any other programming language capable of performing functions of the present invention including, but not limited to, scanning standard cells for search targets/combinations and storing values for remapping, determining verification data locations, determining if remapping override features are present, determining remapped cell identities and contents as well as other features disclosed herein. The invention can also perform analysis and attribute distribution functions with respect to a single netlist which has multiple copies of a macro or standard cell type stored in more than one location rather than a netlist with a single location. Also, multiple netlists or portions of a netlist can be analyzed by the invention in addition to a single netlist. Also, a variety of network architectures or system storage structures can be used including distributed networking and other forms of user access systems which permit users to remotely access data and programs from other than a stand alone work station. Also, an embodiment of the remapping system 301 can be stored on a storage medium which can loaded into a computer processing system such as that described in FIG. 2.

The invention can also be used with a flat netlist system but will perform invention functions, including verification data analysis and distribution activities, in a different manner than for a hierarchical netlist since cell boundaries (i.e., standard cell types) do not exist in a flat netlist. Typically the input to this invention is a hierarchical netlist which is made up of nested macros (or cell types), which can be nested, and primitives. If a flat netlist is input to the described invention, the specified nets and markers will be distributed across the specified models as described in the invention. Also, no new cells will need to be remapped because there are no macros (and hence no cell boundaries) in a flat netlist, there are only primitives. Therefore, after execution of the invention on a hierarchical netlist, the % CellsUndone 163 data structure will be empty as there are no cell boundaries, and the % MarkedNets 161 data structure will be populated with the markers and net properties as they were distributed throughout the models and nets of the flat netlist.

Generally, an embodiment of the invention determines locations where critical nets, models and ports for the designated models exist in a circuit representation. An embodiment of the invention analyzes standard cells and then determines net, port and other circuit attributes. Standard cell instances are compared with cell instance data to determine if they differ from the standard cell in terms of ports, nets or markers or other circuit attributes. When a differing cell instance is found, then an embodiment of the invention creates a new cell identity as well as a new standard cell for that new cell identity with the circuit attributes that existed in the original standard cell, replacement circuit attributes (e.g., net A1's net name is replaced with "Vcc"), and verification data or properties (e.g., HV marker) which have been associated with circuit elements or entities in the netlist. Determinations of where verification data and circuit attributes is accomplished by analyzing the critical data locations with respect to the netlist and netlist elements and entities such as cells, markers, ports, nets or other circuit attributes of interest.

One embodiment of the override feature of the invention determines if a candidate replacement circuit attribute or added attribute is not desirable according to a predefined subroutine which performs a specified operation when it is determined a replacement or addition to a new standard cell is not desirable. New standard cells which are different than the standard cell(s) are stored, in this embodiment with the pre-existing standard cells in a netlist.

One embodiment of the invention creates a unique name for each new standard cell which includes a change attribute identifier, e.g., CellA becomes CellA_5, where 5 indicates a particular type of change has occurred. The change attribute which is appended to the cell is stored separately in a change management database, which can be used to look up change information for the circuit transformation actions.

An embodiment of the invention continues to check cell instances in the circuit representation to determine if a cell instance differs from a selected standard cell until all standard cells and instance data for selected standard cell have been scanned and new cell instances created which include data for differing circuit attributes. Once all cells have been scanned, then a netlist has new standard cells added which comprise the original standard cells as well as the new versions of the original standard cells which include circuit attributes which were not present in the original circuit representation. In one embodiment, the netlist will be updated to show new standard cell instances replacing corresponding original standard cell instances which differed from an original standard cell.

While an exemplary embodiment of the invention has been described and illustrated, it should be apparent that many changes and modifications can be made without departing from the spirit or scope of the invention. Accordingly, the invention is not limited by the description above but is only limited by the scope of the appended claims.

What is claimed is:

1. A circuit representation analysis and verification data propagation system comprising:
   a first data structure for storing a first plurality of search target data;
   a second data structure for storing a circuit representation;
   a first processing sequence for locating a search target within said second data structure;
   a second processing sequence for:
      selecting a first circuit entity in said circuit representation in said second data structure; and
      determining verification data locations in said first circuit entity for placement of verification data based upon relationships of one or more said first plurality of search target data to one or more elements within the circuit representation which are related to said first circuit entity;
   a third processing sequence for creating a second circuit entity which comprises a plurality of related circuit elements within said second data structure and verification data placed in said verification data locations; and
   a fourth processing sequence for storing said circuit entities in said second data structure.

2. The system of claim 1, wherein said first circuit entity and second circuit entity each comprise a plurality of circuit elements.

3. The system of claim 1, wherein said plurality of circuit elements of said second circuit entity further comprises one or more circuit elements from within said second data structure and verification data placed in said verification data locations as determined by said second processing sequence.

4. The system of claim 1, wherein verification data placed in said verification data locations comprises first verification data identifiers which replaced circuit element identifiers initially stored in said second data structure as well as second verification data identifiers which were added to said second circuit entity.

5. The system of claim 1, wherein said first plurality of search target data comprises one or more circuit representation entities, nets, marker property data or model and port combinations which may be found in said second data structure.

6. The system of claim 1, further comprising:
   a fourth data structure which stores a second plurality of search targets, each search target comprises a set of related element identifiers which may be found in a circuit representation stored in said second data structure;
   a fifth processing sequence for determining if a said verification location data has circuit elements which match one or more search targets within second plurality of search targets; and
   a fifth data structure which comprises one or more other processing sequences which are to be executed in place of the third processing sequence if a match is found between circuit elements of a said verification location and said second plurality of search targets.

7. The system of claim 1, further comprising a processing sequence which provides an error message or perform another specified action based upon a failure of a processing sequence to locate a specific search target within said second data structure.

8. The system of claim 1, wherein said interconnective pathways comprise a net.

9. The system of claim 1, wherein search targets comprise one or more net, port, cell, instance, model identifier or combination of one or more nets, ports, instances, cells or model identifiers which are found in said circuit representation.

10. The system of claim 1, wherein said circuit representation is a hierarchical netlist.

11. The system of claim 1, further comprising:
a fifth processing sequence that determines if said second circuit entity has been previously stored; and
a sixth processing sequence which aborts the fourth processing sequence and continues processing if said fifth processing sequence determines if said second circuit entity has previously been stored in said second data structure.

12. The system of claim 1, further comprising:
a fifth processing sequence which creates a change identifier which indicates the changes which were specified by the second processing sequence, wherein said changes describe the change or addition that was identified by verification data location and the applicable verification data which is to be placed in said location in said second circuit entity; and
a fifth processing sequence for creating an identifier for said second circuit entity which comprises a first circuit entity name for said selected first circuit entity coupled with said change identifier.

13. A circuit representation analysis and verification data propagation system comprising:
a first data structure for storing a first plurality of search target data;
a second data structure for storing a first circuit representation;
a third data structure for storing a second circuit representation;
a first processing sequence for locating a search target within said second data structure;
a second processing sequence for analyzing said first circuit representation in said second data structure by determining verification data locations for placement of verification data in said first circuit representation based upon relationships of one or more said search target data to one or more elements within the first circuit representation;
a third processing sequence for creating one or more circuit entities which describe combinations of a plurality of circuit elements within said second data structure with verification data placed in said verification data locations; and
a fourth processing sequence for storing said circuit entities in said third data structure.

14. The system of claim 13, wherein said first plurality of search target data comprises one or more net or marker data which may be found in said second data structure.

15. The system of claim 13, wherein search targets comprise one or more net, port, cell, instance, model identifier or combination of one or more nets, ports, instances, cells or model identifiers which is found in said first circuit representation.

16. The system of claim 13, further comprising:
a fourth data structure which stores a second plurality of search targets, each search target comprises a set of related element identifiers which may be found in a first circuit representation stored in said second data structure;
a fifth processing sequence for determining if said verification location data has circuit elements which match one or more search targets within second plurality of search targets; and
a sixth data structure which comprises one or more processing sequences which are to be executed if a match between circuit elements of a said verification location and said second plurality of search targets.

17. The system of claim 13, further comprising a fourth processing sequence which provides an error message or perform another specified action based upon a failure of a processing sequence to locate a specific search target within said second data structure.

18. The system of claim 13, wherein said second processing sequence determination of verification data locations further comprises placing a first verification data at a location wherein a circuit attribute or element associated with a critical data location matches a pattern or selection criteria associated with a critical circuit attribute data stored in said first data structure, said first verification data is associated with said critical circuit attribute.

19. The system of claim 13, wherein said first circuit representation is a hierarchical netlist.

* * * * *

UNITED STATES PATENT AND TRADEMARK OFFICE
CERTIFICATE OF CORRECTION

| | | |
|---|---|---|
| PATENT NO. | : 7,240,316 B2 | Page 1 of 1 |
| APPLICATION NO. | : 10/122381 | |
| DATED | : July 3, 2007 | |
| INVENTOR(S) | : John W. Regnier | |

It is certified that error appears in the above-identified patent and that said Letters Patent is hereby corrected as shown below:

In the Specification, the following errors are corrected:

Column 4, line 3, "include" should read --includes--;

Column 4, line 36, "since is" should read --since it is--;

Column 7, line 42, "(i.e. "resistor")" should read --(i.e., "resistor")--;

Column 7, line 43, "is used" should read --are used--;

Column 12, line 46, "instances" should read --instance--;

Column 15, line 39, "and" should read --an--;

Column 15, line 44, "exist" should read --exists--;

Column 16, line 25, "519, then the" should read --519, the--; and

Column 21, line 46, "cell" should read --cells--.

In the Claims, the following errors are corrected:

Claim 6, column 22, line 47, "within second" should read --within said second--, and Claim 16, column 24, line 19, "within second" should read --within said second--.

Signed and Sealed this

Fourth Day of September, 2007

JON W. DUDAS
*Director of the United States Patent and Trademark Office*